United States Patent
Sekiguchi

(10) Patent No.: US 8,686,621 B2
(45) Date of Patent: Apr. 1, 2014

(54) PIEZOELECTRIC DEVICES AND METHODS FOR MANUFACTURING THE SAME

(75) Inventor: Hiroki Sekiguchi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 43 days.

(21) Appl. No.: 13/400,583

(22) Filed: Feb. 21, 2012

(65) Prior Publication Data
US 2012/0212105 A1 Aug. 23, 2012

(30) Foreign Application Priority Data
Feb. 23, 2011 (JP) .................................. 2011-036700

(51) Int. Cl.
*H01L 41/053* (2006.01)
(52) U.S. Cl.
USPC .......................................... 310/344; 310/348
(58) Field of Classification Search
USPC ................................................. 310/344, 348
See application file for complete search history.

(56) References Cited

U.S. PATENT DOCUMENTS

| | | | | |
|---|---|---|---|---|
| 5,925,973 A | * | 7/1999 | Eda et al. ........................ | 310/348 |
| 6,534,901 B1 | * | 3/2003 | Tsuzuki et al. ................. | 310/348 |
| 7,161,282 B2 | * | 1/2007 | Koike et al. .................... | 310/348 |
| 7,378,780 B2 | * | 5/2008 | Mizumura et al. ............. | 310/341 |
| 8,147,632 B2 | * | 4/2012 | Banks et al. .................. | 156/89.11 |
| 2009/0127696 A1 | * | 5/2009 | Matsumoto .................... | 257/698 |
| 2012/0139391 A1 | * | 6/2012 | Mizusawa et al. ............. | 310/344 |
| 2012/0229002 A1 | * | 9/2012 | Takahashi ...................... | 310/344 |

FOREIGN PATENT DOCUMENTS

| | | | |
|---|---|---|---|
| JP | 2006-148758 | 6/2006 | |
| JP | 2007-243681 A | * 9/2007 | ............... H03H 9/02 |

* cited by examiner

*Primary Examiner* — Thomas Dougherty
(74) *Attorney, Agent, or Firm* — Jianq Chyun IP Office

(57) ABSTRACT

The purpose of the present disclosure is to provide a piezoelectric device that is less likely to be damaged during the cutting process from a wafer into individual pieces, and can be measured at the wafer without being affected by adjacent piezoelectric devices. The piezoelectric device includes: a first plate which constitutes a part of the package for storing the vibrating portion, having a pair of first edges and second edges situated vertically to the first edges; a second plate bonded to the first plate and constitutes another part of the package for storing the vibrating portion; and an adhesive for bonding the first plate and the second plate together. A pair of castellations is formed on each first edge, situated symmetrical to a straight line that passes through a centerline of the first plate and is parallel to the second edge. The present disclosure also provides methods for manufacturing.

6 Claims, 20 Drawing Sheets

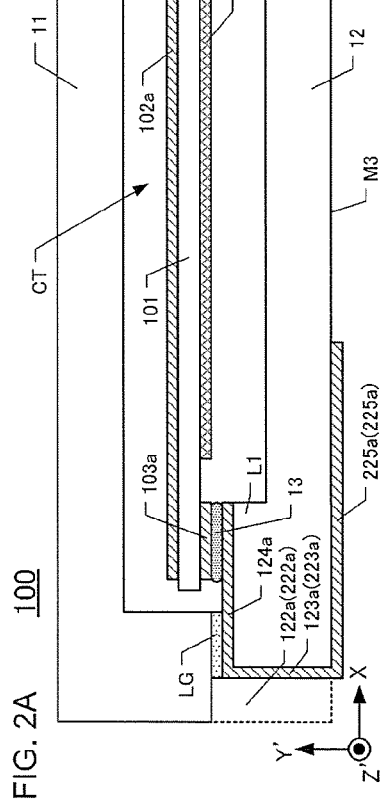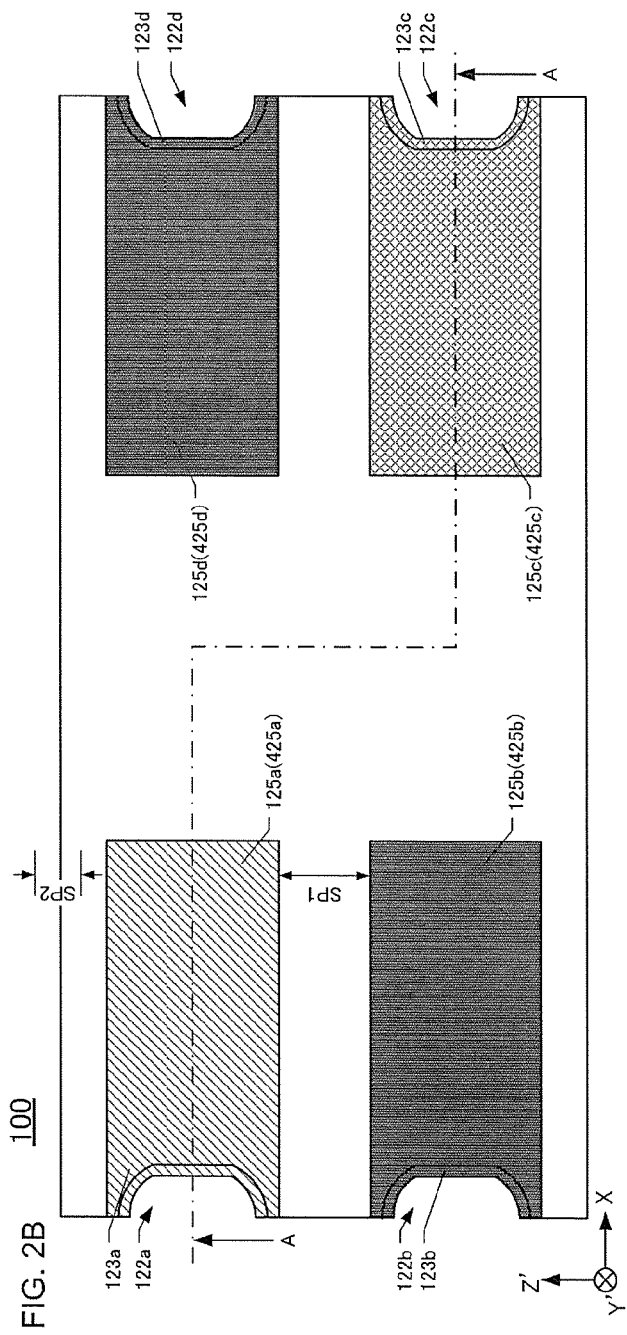

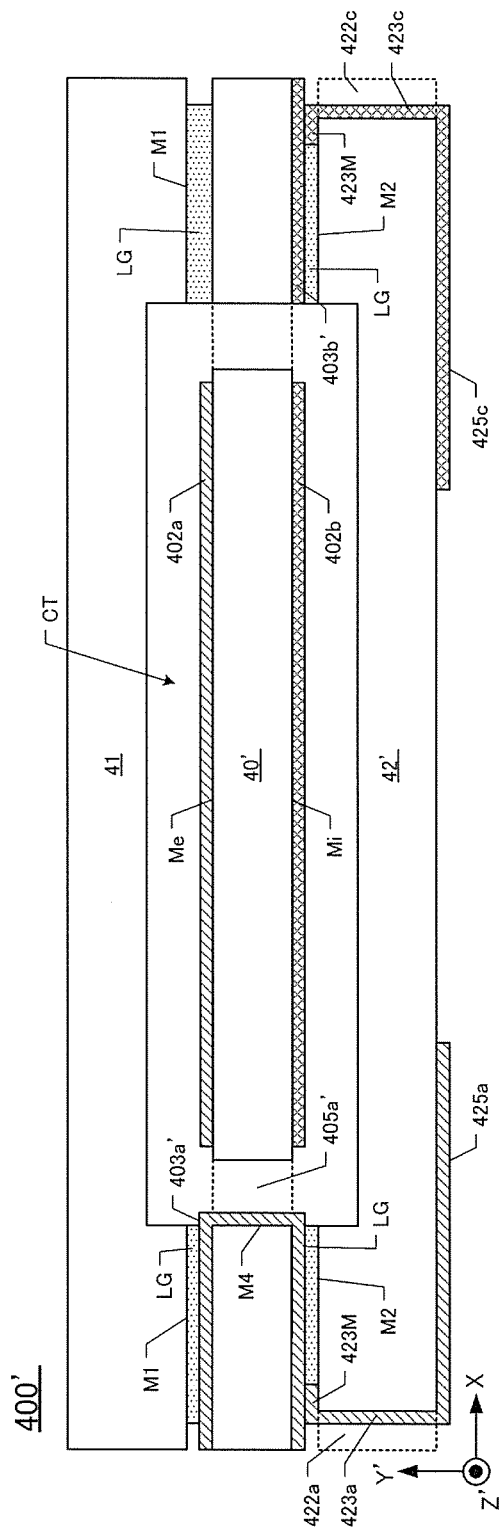

PIEZOELECTRIC DEVICES AND METHODS FOR MANUFACTURING THE SAME

CROSS-REFERENCE TO RELATED APPLICATION

This application claims priority to and the benefit of Japan Patent Application No. 2011-036700, filed on Feb. 23, 2011, in the Japan Patent Office, the disclosure of which is incorporated herein by reference in its respective entirety.

FIELD OF THE INVENTION

This disclosure pertains to piezoelectric devices in which a plurality of package lids and package bases are manufactured from a wafer. This disclosure also pertains to methods for manufacturing such devices.

BACKGROUND OF THE INVENTION

Surface-mountable piezoelectric devices are preferably manufactured by mass-production. In the piezoelectric device disclosed in Japan Unexamined Patent Document No. 2006-148758, a quartz-crystal wafer having a plurality of quartz-crystal vibrating pieces is sandwiched between a lid wafer and a base wafer, wherein all three wafers have the same shape. Also, in the methods for manufacturing piezoelectric devices as disclosed in Japan Unexamined Patent Document No. 2006-148758, through-holes are made on the lid wafer and the base wafer for each corner of a package lid and a package base. An edge wire is formed on each device for electrically connecting the respective excitation electrodes with respective external terminals on each corner of the piezoelectric device. Then, the piezoelectric devices manufactured on the wafer are separated into individual pieces.

However, in the method of Japan Unexamined Patent Document No. 2006-148758 for manufacturing piezoelectric devices at a wafer scale, the through-holes are situated on each corner of a piezoelectric device, the adjacent piezoelectric devices remain as one unit. Whenever a piezoelectric device is cut along an edge, load is applied onto the piezoelectric device, and causes damage to the piezoelectric device. Also, the adjacent excitation electrodes of the adjacent piezoelectric devices are electrically connected by edge-surface electrodes formed on the through-holes. Therefore, the vibration frequency produced by individual piezoelectric vibrating pieces on the wafer cannot be measured.

In view of the foregoing, the present disclosure provides piezoelectric devices in which each piezoelectric device is less likely to be damaged during the cutting process into individual piezoelectric devices. The vibration frequencies of a plurality of piezoelectric devices on the wafer can be measured without being affected by adjacent piezoelectric devices. The present disclosure also provides methods for manufacturing such piezoelectric devices.

SUMMARY OF THE INVENTION

A first aspect of the present disclosure pertains to piezoelectric devices. In the first aspect, the piezoelectric devices comprise a vibrating portion that vibrates, whenever electrical voltage is applied. The piezoelectric devices comprise: a first plate having a rectangular profile, wherein the first plate includes a pair of straight first edges and a pair of straight second edges situated vertically to the first edges and constitutes a part of the package for storing the vibrating portion; a second plate having a rectangular profile, wherein the second plate is bonded to the first plate and constitutes the other part of the package for storing the vibrating portion; and adhesive for bonding together the first plate and the second plate. A pair of castellations is formed on each first edge, the castellations being recessed toward a center of the package base, and castellations are situated symmetrically to a straight line that passes through a centerline of the first plate and is parallel to the second edge.

A second aspect of the present disclosure pertains to piezoelectric devices. In the second aspect, the first plate comprises a package base for mounting the vibrating portion and forming the piezoelectric device; and the second plate comprises a package lid bonded onto the package base and hermetically seals the vibrating portion.

A third aspect of the present disclosure pertains to piezoelectric devices. In the third aspect, the second plate of the piezoelectric devices comprises a piezoelectric frame having the vibrating portion and an outer frame surrounding the vibrating portion thereof for constituting a part of the package; the first plate comprises a package base that is bonded onto a first surface of the frame portion of the piezoelectric frame; and the piezoelectric device further comprises a package lid that is bonded to a second surface of the frame portion of the piezoelectric frame, the package lid constitutes a part of the package for hermetically sealing the vibrating portion.

A fourth aspect of the present disclosure pertains to piezoelectric devices. In the fourth aspect, the first plate and the second plate are bonded using an adhesive, and the adhesive is fabricated from a glass material that melts between 350° C. to 410° C.

A fifth aspect of the present disclosure pertains to a method for manufacturing a piezoelectric device comprising a vibrating portion that vibrates when electrical voltage is applied. The method comprising the steps of: preparing a first wafer constituting a part of a package for storing the vibrating portion, the first wafer comprises a plurality of first plate having a rectangular profile constituted of a pair of first edges and a pair of second edges situated vertically to the first edges; forming through-holes situated at a cross-point between the first edge and the second edge to a center of the first edge, the through-holes extend through the first wafer depthwise; preparing a second wafer comprising a plurality of second plates having a rectangular profile, the second plates constitute a part of a package for storing the vibrating portion; first bonding step for bonding the first wafer and the second wafer using an adhesive; performing a first cutting step after the first bonding step, the first cutting step comprises a step of cutting the first wafer and the second wafer along the first edge; and performing a second cutting step after the first cutting step, the second cutting step comprises a step of cutting the first wafer and the second wafer along the second edge.

A sixth aspect of the present disclosure pertains to a method for manufacturing a piezoelectric device. In the sixth aspect, the first wafer comprises a base wafer having a plurality of package bases where the vibrating portions are mounted; and the second wafer comprises a lid wafer having a plurality of package lids that is bonded to the base wafer for hermetically sealing the vibrating portion.

A seventh aspect of the present disclosure pertains to a method for manufacturing a piezoelectric device. In the seventh aspect, the second wafer comprises a piezoelectric wafer; wherein the second wafer comprises a plurality of piezoelectric frames having the vibrating portion and an outer frame that surrounds the vibrating portion and forms a part of the package; the first wafer comprises a base wafer bonded to an entire surface of the piezoelectric wafer and includes a plurality of package bases. The method comprises a step for preparing a lid wafer comprising a plurality of package lids that constitutes the package for hermetically sealing the frame portion, the package base and the vibrating portion; and before the first cutting step, performing a second bonding step for bonding the lid wafer onto the other surface of the piezoelectric wafer using an adhesive.

An eighth aspect of the present disclosure pertains to a method for manufacturing a piezoelectric device. In the eighth aspect, during the first wafer preparation step, the length of the first edge is shorter than the length of the second edge.

A ninth aspect of the present disclosure pertains to a method for manufacturing a piezoelectric device. In the ninth aspect, during the first cutting step, the through-hole is cut in one-half A tenth aspect of the present disclosure pertains to a method for manufacturing a piezoelectric device. In the tenth aspect, during the cutting step, the cut is made along an edge of the through-hole so as to form at least two through-holes in one piezoelectric device.

Effects of Invention

According to the present invention, piezoelectric devices are provided in which each piezoelectric device is less likely to be damaged during the cutting process from a wafer into individual pieces. Such piezoelectric devices can be measured at a wafer without being affected by adjacent piezoelectric devices. The present disclosure also provides methods for manufacturing such devices.

BRIEF DESCRIPTION OF THE DRAWINGS

FIG. 2A is a cross-sectional view of FIG. 1 taken along A-A line.

FIG. 2B is a plan view of the bottom surface of the first quartz-crystal vibrating device 100.

FIG. 19 is a cross-sectional view along the line D-D in FIG. 18B.

In FIG. 20A and FIG. 20B, the vibrating piece 40' is shown as transparent so that the package base 42' can be viewed. FIG. 20B is an exploded view of dotted line E.

DESCRIPTION OF THE PREFERRED EMBODIMENT

In the explanation below, an AT-cut quartz-crystal vibrating piece is used as a piezoelectric vibrating piece. An AT-cut quartz-crystal material has a principal surface (in the YZ plane) that is tilted by 35° 15' about the Y-axis of a crystal-coordinate system (XYZ) in the direction of the Y-axis from the Z-axis around the X-axis. In the following description, new axes tilted with respect to the axial directions of the quartz-crystal material are denoted as the Y'-axis and Z'-axis, respectively. Therefore, in the quartz-crystal device 100, the longitudinal direction of the piezoelectric device is the X-axis direction, the height direction is the Y'-axis direction, and the direction perpendicular to the X-axis and Y'-axis directions is the Z'-axis direction.

First Embodiment

<Overall Configuration of the First Quartz-crystal Vibrating Device 100>

Figure 1:
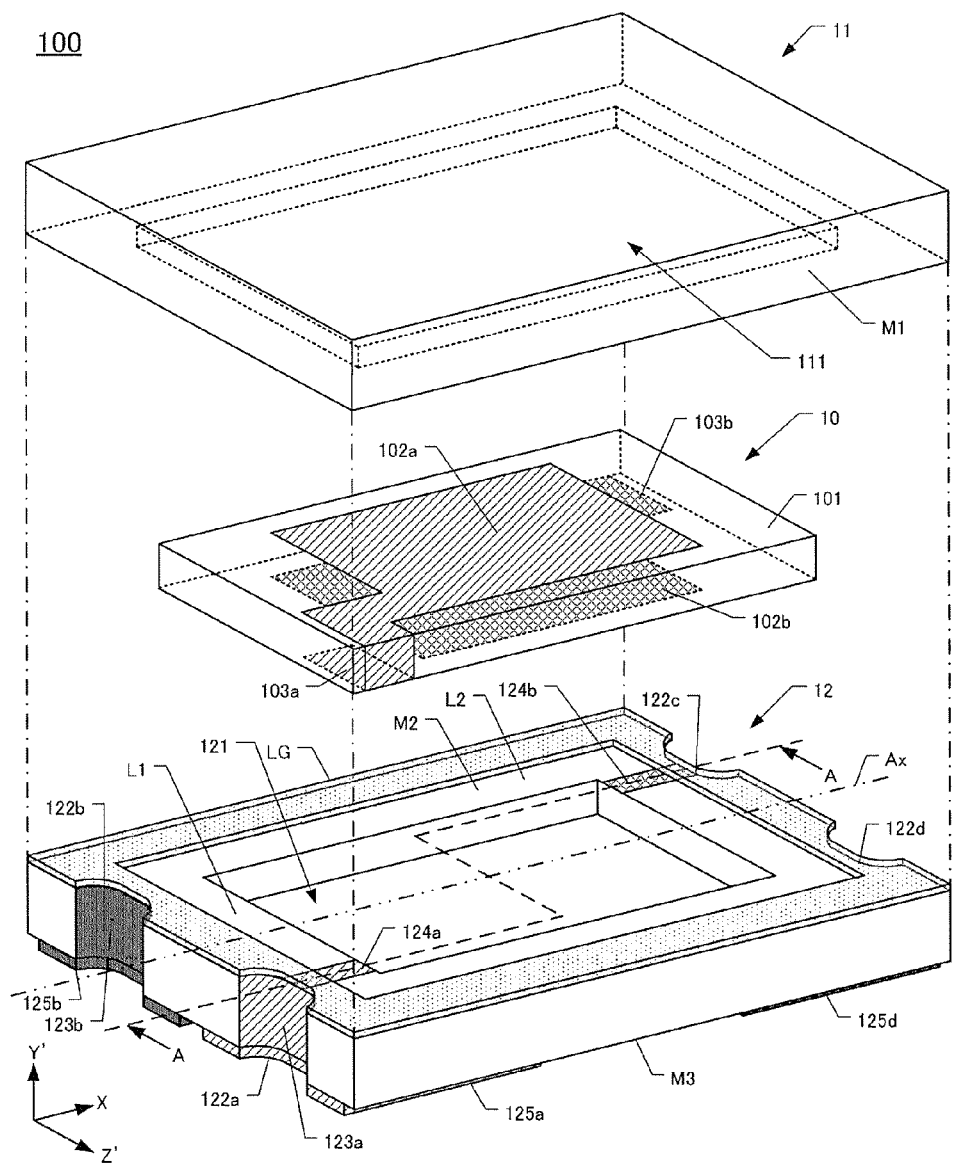
FIG. 1 is an exploded perspective view of a first quartz-crystal vibrating device 100.

Overall configuration of a first quartz-crystal vibrating device 100 is explained with reference to FIGS. 1 and 2. FIG. 1 is an exploded perspective view of the first quartz-crystal vibrating device 100. FIG. 2A is a cross-sectional view of FIG. 1 taken along A-A line. FIG. 2B is a plan view of the bottom surface of the first quartz-crystal vibrating device 100. In FIG. 1, an adhesive low-melting-point glass LG is shown as transparent, so that entire connection electrodes 124a and 124b can be viewed.

As shown in FIGS. 1 and 2, the first quartz-crystal vibrating device 100 comprises a package lid 11 defining a lid recess portion 111, a package base 12 defining a base recess portion 121 and a planar quartz-crystal vibrating piece 10 mounted onto the package base 12.

The quartz-crystal vibrating piece 10 comprises an AT-cut quartz-crystal piece 101 and a pair of respective excitation electrodes 102a and 102b situated substantially in the center of the quartz-crystal piece 101 on the respective principal surfaces thereof. The excitation electrode 102a is connected to a respective extraction electrode 103a, extending in the −X-axis direction on the bottom surface (+Z'-axis side surface) of the quartz-crystal piece 101. The excitation electrode 102b is connected to a respective extraction electrode 103b, extending in the +X-axis direction on the bottom surface (surface on the −Z'-axis side) of the quartz-crystal piece 101. The vibrating piece 10 can be mesa-type or inverted-mesa-type.

Each of the excitation electrode 102a, 102b and the extraction electrode 103a, 103b comprises a foundation layer of chromium (Cr) overlying with a gold layer. An exemplary thickness of the chromium layer is in the range of 0.05 μm to 0.1 μm, and an exemplary thickness of the gold layer is in the range of 0.2 μm to 2 μm.

The package base 12 is fabricated from a glass or piezo-electric material, and comprises a second peripheral surface M2 on its principal surface (+Y'-side surface), circumscribing a base recess 121. The package base 12 is rectangular shape, and comprises a pair of first edges L1 extending in the Z'-axis direction and a pair of second edges L2 extending in the X-axis direction. Four castellations 122 are formed on the first edge L1 of the package base 12.

Specifically, two base castellations 122a, and 122b are formed on the first edge L1 of the package base 12 in the −X-axis direction. The base castellations 122a, 122b are formed simultaneously with the formation of the base through-holes BH1 (see FIGS. 6 and 7). The base castellation 122a is situated on the +Z-axis side, and the base castellation 122b is situated on the −Z-axis side. The base castellations 122a and 122b are formed on each region which is separated by an axis Ax. The axis Ax extends through a center of the package base 12 and is parallel with the second edge L2 (bisecting the piezoelectric device). Thus, the base castellations 122a and 122b are situated symmetrically to an axis Ax and along the Z'-axis direction.

Figure 6:
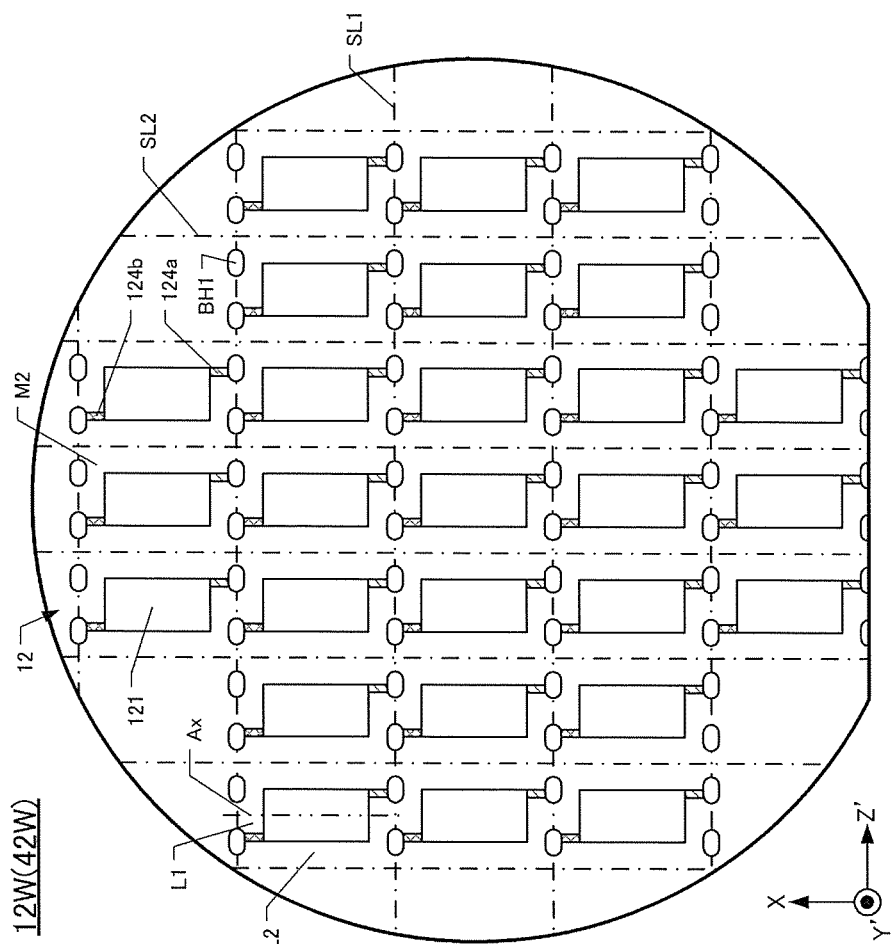
FIG. 6 is a plan view of a base wafer 12W.
Figure 7:
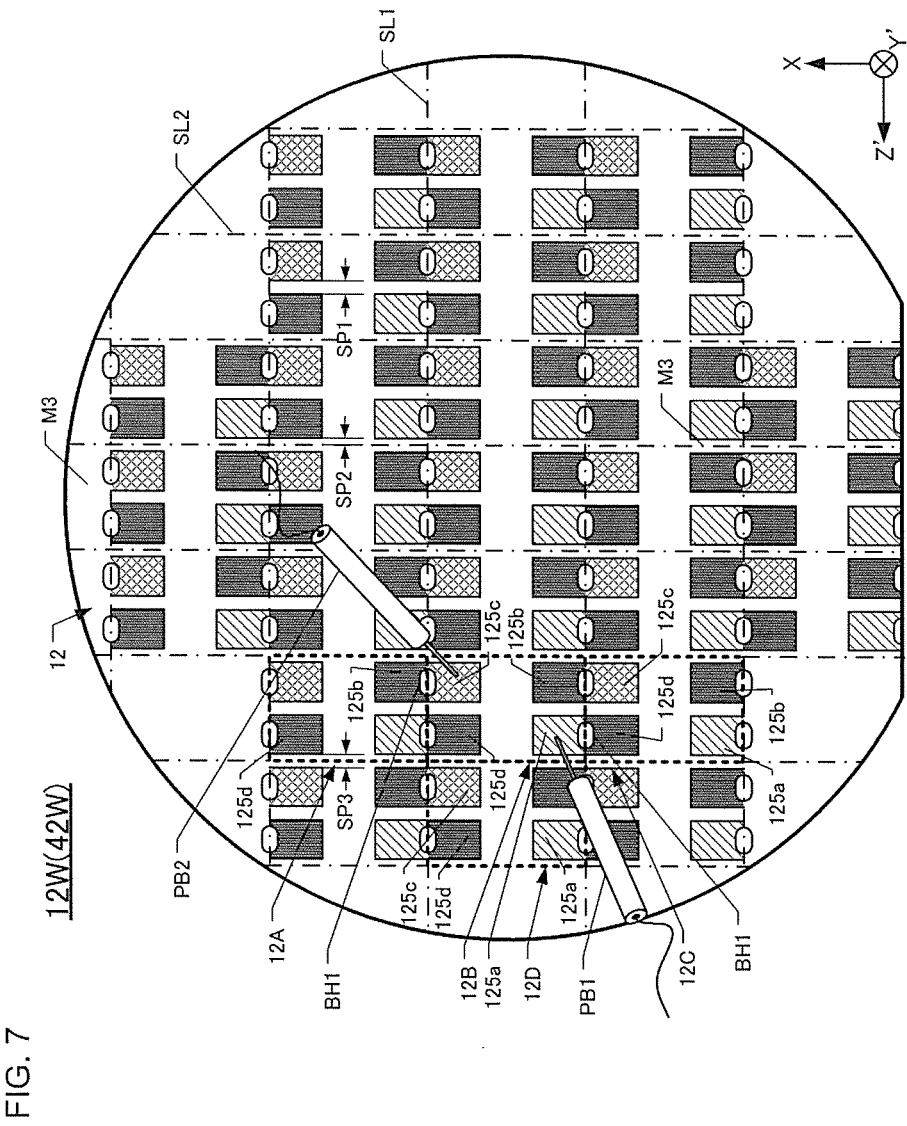
FIG. 7 is a plan view of the bottom surface of a base wafer 12W.

Similarly, two base castellations 122c, 122d are formed on the first edge L1 in the +X-axis direction, and the base through-holes BH1 are simultaneously formed (see FIGS. 6 and 7). Two base castellations extend in the Z'-axis direction. Here, the base castellation 122c extends in the −Z-axis direction, and the base castellation 122d extends in the +Z'-axis direction. The base castellations 122c and 122d are formed on two regions separated by an axis Ax. The axis Ax extends through a center of the package base 12 and is parallel to the second edge L2. Thus, the base castellations 122c and 122d are situated symmetrically to an axis Ax and along the Z'-axis direction.

Preferably, the base castellations 122a and 122c, and the base castellations 122b and 122d are situated point-symmetrically to the center point of the package base 12.

Respective base edge-surface electrodes 123a-123d are on the base castellations 122a-122d. The second peripheral surface M2 of the package base 12 includes a pair of connecting electrodes 124a, 124b. A connecting electrode 124a is electrically connected to the base edge-surface electrode 123a; similarly, a connecting electrode 124b is electrically connected to the base edge-surface electrode 123c. The base edge-surface electrodes 123a, 123c are configured oppose to each other and diagonally across the package base 12.

On the mounting surface M3 of the package base 12 are two pairs of mounting terminals 125a-125d, which are electrically connected to respective base edge-surface electrodes 123a-123d. Of the two pairs of mounting terminals 125a-125d, one pair 125a, 125c serves as mounting electrodes for external electrodes (hereinafter referred as "external electrodes") and connected to respective connecting electrodes 124a, 124b via respective base edge-surface electrodes 123a, 123c. The external electrodes 125a, 125c are situated diagonally on the package base 12. Whenever an alternating voltage (voltage that alternates positive and negative) is applied across the external electrodes 125a, 125c, the vibrating device 10 exhibits a thickness-shear vibration mode.

Of the two pairs of mounting terminals 125a-125d, the other pair of mounting terminals 125b, 125d serves as mounting terminals for grounding electrodes (hereinafter referred as "grounding electrodes") 125b, 125d, used for grounding the base edge-surface electrodes 123b, 123d as necessary. The grounding electrodes 125b, 125d are situated along different diagonals (compared to the external electrodes 125a, 125c). Since the grounding electrodes 125b, 125d are used for grounding, they also include respective terminals for bonding the quartz-crystal vibrating device 100 to the mounting printed board (not shown) without electrical connections.

Referring further to FIG. 2B, the pair of external electrodes 125a, 125c and the pair of grounding electrodes 125b, 125d are situated apart from each other. The external electrode 125a and the grounding electrode 125d are situated apart from one edge of the package base 12 in the +Z'-axis direction. The grounding electrode 125b and the external electrode 125c are formed apart from each other in the −Z'-axis direction. A space SP1 is situated between each external electrode 125a and its corresponding grounding electrode 125b and between each external electrode 125c and its corresponding grounding electrode 125d in the Z'-axis direction. The width of the space SP1 is, for example, 200 μm to 500 μm. Also, a space SP2 is situated between each external electrode 125a and the adjacent edge of the package base 12, between each grounding electrode 125d and the adjacent edge of the package base 12, between each grounding electrode 125b and the adjacent edge of the package base 12, between each external electrode 125c and the adjacent edge of the package base 12. The space SP2 is, for example, 0 μm to 100 μm wide in the Z-axis direction.

In the first quartz-crystal vibrating device 100, the quartz-crystal vibrating piece 10 is longer in the X-axis direction than the base recess 121. Therefore, whenever a quartz-crystal vibrating piece 10 is mounted onto a package base 12 using electrically conductive adhesive 13, both X-direction edges of the quartz-crystal vibrating piece 10 mount to the second peripheral surface M2 of the package base 12, as shown in FIG. 2A. Thus, the extraction electrodes 103a, 103b on the quartz-crystal vibrating piece 10 are electrically connected to respective connecting electrodes 124a, 124b on the package base 12. Hence, the respective external electrodes 125a, 125c are connected to respective excitation electrodes 102a, 102b through the respective base edge-surface electrodes 123a, 123c, the respective connecting electrodes 124a, 124b, the electrically conductive adhesive 13, and the extraction electrodes 103a, 103b.

The package lid 11 comprises a lid recess 111 having a greater area in the XZ' plane than the base recess 121. A first peripheral surface M1 circumscribes the lid recess 111. Whenever the first peripheral surface M1 of the package lid 11 and the second peripheral surface M2 of the package base 12 are bonded together, a cavity CT is defined in which the quartz-crystal vibrating piece 10 is situated. The cavity CT is defined in part by the lid recess 111 and in part by the base recess 121. The cavity CT is filled with an inert-gas or is under a vacuum.

The first peripheral surface M1 of the package lid 11 and second peripheral surface M2 of the package base 12 are bonded together using a sealing material (non-electrically conductive adhesive), for example a low-melting-point glass LG. Low-melting-point glass LG is a lead-free vanadium-based glass having an adhesive component that melts at 350° C. to 410° C. Vanadium-based glass can be formulated as a paste mixed with a binder and a solvent. Vanadium-based glass bonds to various materials by melting and solidifying. Low-melting-point glass forms a highly reliable air-tight seal and resists water and humidity. Also, since the coefficient of thermal expansion of a low-melting-point glass can be controlled effectively by controlling its glass structure, this material can adjust to various coefficients of thermal expansion.

Regarding the package lid 11, the lid recess 111 is longer in the X-axis direction than the quartz-crystal vibrating piece 10 in the X-axis direction and the base recess 121 in the X-axis direction. Also, as shown in FIGS. 1 and 2A-2B, the low-melting-point glass LG bonds the package lid 11 and the package base 12 at the second peripheral surface M2, having a width of approximately 300 μm.

Although the quartz-crystal vibrating piece 10 of this embodiment is mounted inside the package on the second peripheral surface M2 of the package base 12, the vibrating piece can be stored inside the base recess 121. In such an instance, the connecting electrodes are parts of respective base castellations 122a, 122c and extend to the bottom surface of the base recess 121 via the second peripheral surface M2. Alternatively, the package lid can be planar and without a recess.

<Method for Manufacturing the First Quartz-crystal Vibrating Device 100>

Figure 3:
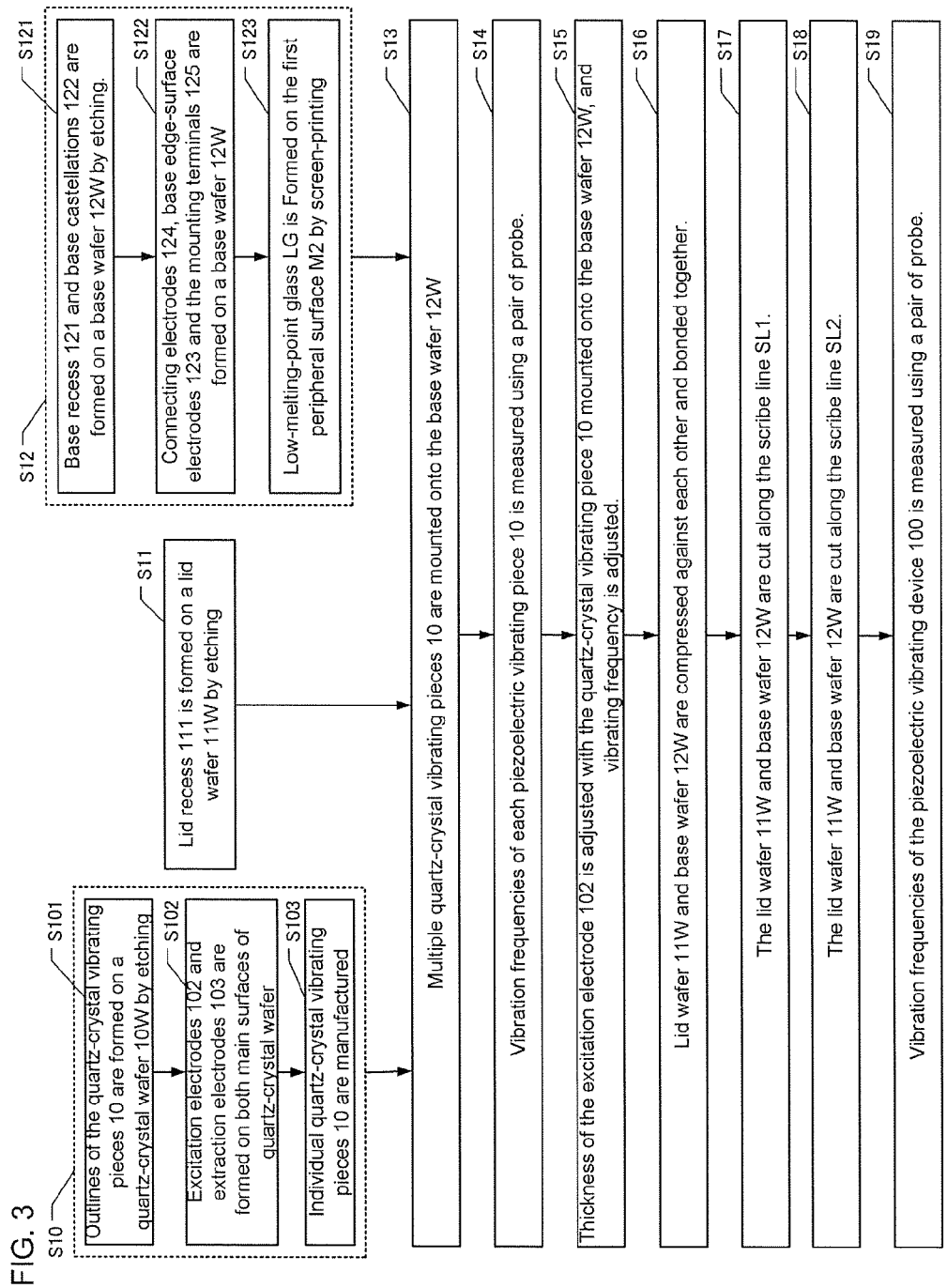
FIG. 3 is a flow-chart of steps in exemplary processes that may be used in an embodiment of a manufacturing method for a quartz-crystal vibrating device 100 of the first embodiment.
Figure 4:
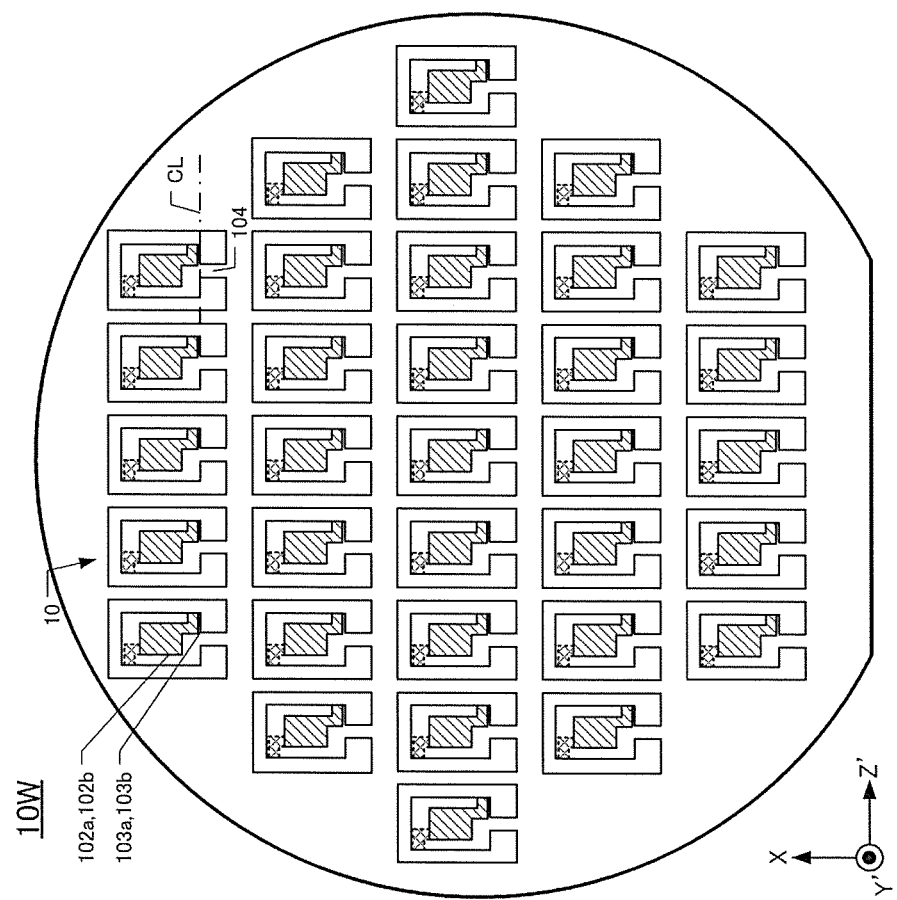
FIG. 4 is a plan view of a quartz-crystal wafer 10W.
Figure 5:
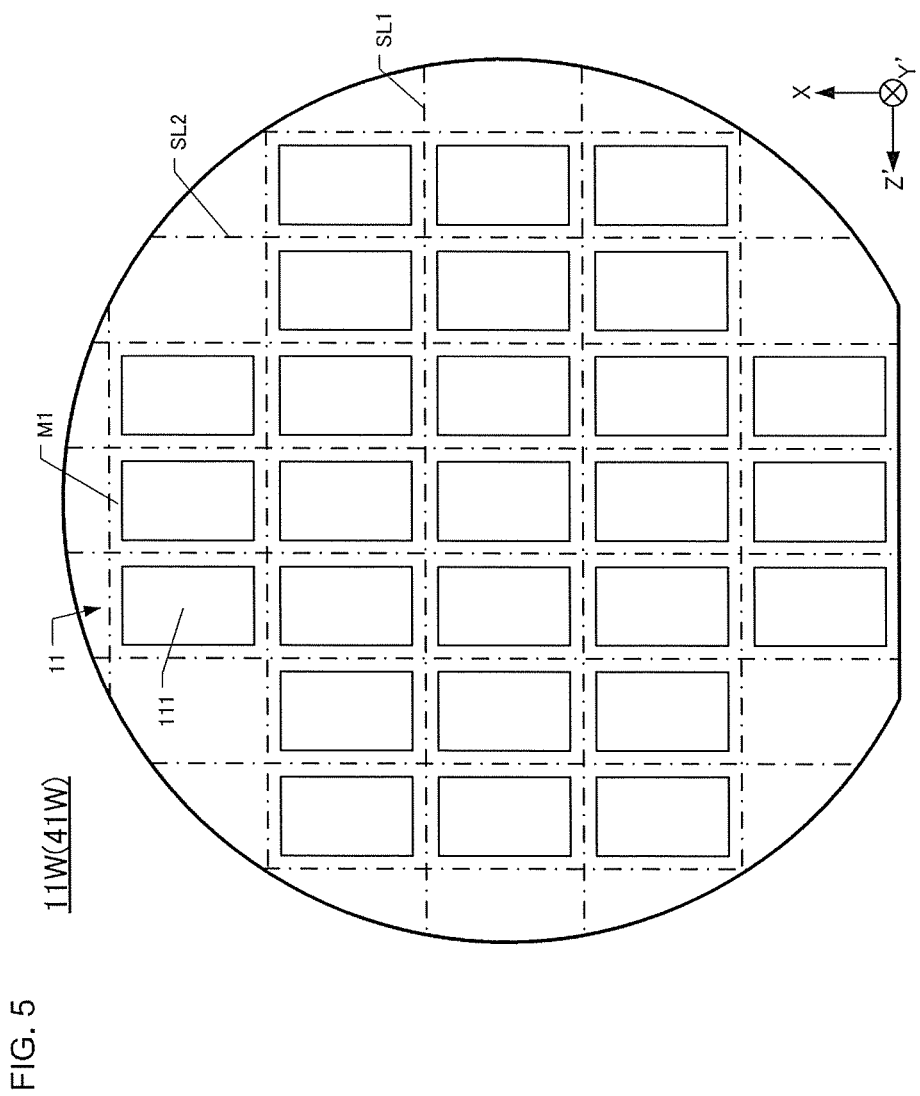
FIG. 5 is a plan view of a lid wafer 11W.

FIG. 3 is a flow-chart of steps in exemplary processes that may be used in an embodiment of a manufacturing method for a quartz-crystal vibrating device 100 of the first embodiment. In FIG. 3, a protocol S10 for manufacturing the quartz-crystal vibrating piece 10, a protocol S11 for manufacturing the package lid 11 and a protocol S12 for manufacturing the package base 12 can be carried out separately or concurrently. FIG. 4 is a plan view of a quartz-crystal wafer 10W in which a plurality of quartz-crystal vibrating pieces 10 can be manufactured simultaneously. FIG. 5 is a plan view of a lid wafer 11W in which a plurality of package lids 11 can be manufactured simultaneously. FIG. 6 is a plan view of a base wafer 12W in which a plurality of package bases 12 can be manufactured simultaneously. FIG. 7 is a plan view of the bottom surface of a base wafer 12W.

In protocol S10, the quartz-crystal vibrating piece 10 is manufactured. The protocol S10 includes steps S 101-S 103.

In step S101 (see FIG. 4) the profile outlines of multiple quartz-crystal vibrating pieces 10 are formed on the planar surface of the quartz-crystal wafer 10W by etching. Each quartz-crystal vibrating piece 10 is connected to the quartz-crystal wafer 10W by a respective joining portion 104.

In step S102 a layer of chromium is formed, followed by forming an overlying layer of gold, on both main surfaces as well as the edge surfaces of the entire quartz-crystal wafer 10W by sputtering or vacuum-deposition. Then, a photoresist is applied uniformly on the surface of the metal layer. Using an exposure apparatus (not shown), the profile outlines of the excitation electrodes and of the extraction electrodes are lithographically exposed onto the crystal wafer 10W. Next, regions of the metal layer exposed by photoresist are denuded by etching. As shown in FIG. 4, etching forms the excitation electrodes 102a, 102b and extraction electrodes 103a, 103b on both main surfaces and edge surfaces of the quartz-crystal wafer 10W.

In step S103 the quartz-crystal vibrating pieces 10 on the crystal wafer are cut to separate individual devices. During cutting, cuts are made along cut lines CL (denoted by dot-dash lines in FIG. 4) using a dicing unit such as a laser beam or dicing saw.

In protocol S11, the package lid 11 is manufactured. As shown in FIG. 5, several hundreds to several thousands of lid recesses 111 are formed on a main surface of a lid wafer 11W, with the latter being a circular, uniformly planar plate of a quartz-crystal material. The lid recesses 111 are formed in the lid wafer 11W by etching or mechanical processing, leaving the first peripheral surfaces M1 around the lid recesses 111.

In protocol S12, the package base 12 is manufactured. Protocol S12 includes steps S121-S123.

In step S121, as shown in FIG. 6, several hundreds to several thousands of base recesses 121 are formed on the base wafer 12W, the latter being a circular, uniformly planar plate of quartz-crystal material. Multiple base recesses 121 are formed on the base wafer 12W by etching or mechanical processing, and the second peripheral surfaces M2 circumscribe the respective base recesses 121. Two rounded-rectangular base through-holes BH1 are formed on the pair of first edge L1 of each package base 12 simultaneously. The base through-holes BH1 extend depthwise through the base wafer 12W. Two base through-holes BH1 are situated symmetrically to an axis Ax and along the Z'-axis direction. Whenever a base through-hole BH1 is cut in half during dicing, it forms a respective base castellation 122a-122d (FIG. 1).

In step S122, a foundation layer of chromium (Cr) is formed, followed by a subsequent formation of an overlying layer of gold (Au) on both main surfaces of the base wafer 12W by sputtering or etching. Then, as shown in FIG. 6, the connecting electrodes 124a, 124b are formed on the second peripheral surface M2 by etching. Simultaneously, the base edge-surface electrodes 123a-123d are formed on the entire surfaces of the base through-holes BH1 (FIG. 1).

A pair of external electrodes 125a, 125c and a pair of grounding electrodes 125b, 125d is formed on the bottom surface of the base wafer 12W simultaneously, as shown in FIG. 7. Here, the external electrodes and grounding terminals formed on the package base 12 in adjacent X-axis directions are formed as one unit (electrically connected status). Specific explanations are made using four package bases (12A-12D) indicated with surrounding dotted lines. The external electrode 125a on the package base 12B, the grounding electrode 125d on the package base 12C, and the base edge-surface electrodes 123a, 123d on the base through-holes BH1 are formed simultaneously. Also, the external electrode 125c on the package base 12B, the grounding electrode 125b on the package base 12A, and the base edge-surface electrodes 123b, 123c are formed simultaneously. Further, the grounding terminals (including external electrodes and grounding electrodes) on the package base 12B are formed at a space SP3 away from the external electrodes and grounding electrodes formed on the package base 12D. Here, the space SP3 is in the range of approximately 40 μm to 280 μm. If, for example, the space SP3 is 40 μm, and if the width of a dicing cut (described later in step S17) is 40 μm, the space SP2 indicated in FIG. 2B would be 0 μm. Consequently, the external electrodes and grounding electrodes formed on the adjacent package bases 12 in the X-axis direction are connected and the external electrodes and grounding electrodes formed on the adjacent package bases 12 in the Z'-axis direction are disconnected.

In step S123, the low-melting point glass LG is printed on the second peripheral surface M2 at the corresponding position to the first peripheral surface M1. A film of low-melting-point glass is formed on the second peripheral surface M2 of the base wafer 12W by preliminary curing. Although the low-melting-point glass LG is formed on the second peripheral surface M2 of the package base 12 in this embodiment, it can alternatively be formed on the first peripheral surface M12 of the package base 11. In this case, the film of low-melting-point glass LG is preferred not to be formed on a position which corresponds to the base through-holes BH1.

In step S13, each quartz-crystal vibrating piece 10 manufactured in protocol S10 is mounted onto the second peripheral surface M2 of the package base 12 formed on the base wafer 12W using electrically conductive adhesive 13. The quartz-crystal vibrating piece 10 is mounted onto the second peripheral surface M2 of the package base 12 so as to align the extraction electrodes 103a, 103b formed on the quartz-crystal vibrating piece 10 with respective connecting electrodes 124a, 124b formed on the second peripheral surface M2 of the package base 12. Thus, several hundreds to several thousands of quartz-crystal vibrating pieces 10 are mounted onto the base wafer 12W.

In step S14, a pair of probes PB1, PB2 (refer to FIG. 7) for measuring vibration frequency in brought into contact with a pair of external electrodes 125a and 125c on the package base 12. Thus, the vibration frequency of each quartz-crystal vibrating piece 10 is measured.

Referring to FIG. 7, even if an alternating voltage is applied to the external electrodes 125a, 125c on the package base 12B via the probes PB1, PB2, the external electrodes 125a, 125c on the package base 12A, 12C, 12D do not electrically connect with each other. Thus, the package base 12B is not affected by other quartz-crystal vibrating pieces 10 on the package bases 12A, 12C, 12D. This allows the vibration frequency of the quartz-crystal vibrating piece 10 on the package base 12 to be measured accurately, at the wafer, before dicing. Also, in step S14, although the probes PB1, PB2 for measuring vibration frequency are brought into contact with the external electrodes 125a, 125c, the probes alternatively contact the connecting electrodes 124a, 124b or to the base edge-surface electrodes 123a, 123c, for obtaining measurements of the vibration frequency of the quartz-crystal vibrating pieces 10.

In step S15, the thickness of the excitation electrode 102a on the quartz-crystal vibrating piece 10 is adjusted. The thickness can be adjusted by sputtering a metal onto the excitation electrode 102a to increase its mass (and thus to decrease its vibration frequency), or by evaporating some metal from the excitation electrode 102a to decrease its mass (and thus to increase its vibration frequency). This method for adjusting vibration frequency is discussed in Japan Unexamined Patent Document 2009-141825, in which the assignee is the same as the assignee of the present disclosure. If the measured vibration frequency is within its pre-specified proper range, then adjustment of vibration frequency is not required.

The vibration frequency of one quartz-crystal vibrating piece 10 can be measured in step S14, then the vibration frequency of the one quartz-crystal vibrating piece 10 can be adjusted in step S15. This step is repeated for all quartz-crystal vibrating pieces 10 situated on the base wafer 12W. Also, in step S14, after measuring the vibration frequencies of all the quartz-crystal vibrating pieces 10 situated on the base wafer 12W, in step S15, the vibration frequency of the quartz-crystal vibrating pieces 10 can be adjusted one-by-one.

In step S16 the low-melting-point glass LG is heated as the lid wafer 11W and base wafer 12W are compressed against each other. Thus, the lid wafer 11W and base wafer 12W are bonded together by the low-melting-point glass LG.

In step S17 the bonded-together lid wafer 11W and base wafer 12W are cut along the Z'-axis direction. This cutting is performed by using a dicing unit such as a laser beam or a dicing saw. In step S17, the bonded-together lid wafer 11W and base wafer 12W is cut until separated along the scribe line SL, denoted by the dot-dash lines in FIGS. 5-7. Thus, the lid wafer 11W and base wafer 12W are cut separately along the first edge L1 which the base through-holes BH1 are formed. Here, since no load is applied onto the base wafer 12W whenever the dicing unit passes through the through-hole BH1, the duration of the wafers being loaded will be shortened. This prevents damage to the base wafer 12W, such as the peeling of electrodes.

In step S18 the bonded-together lid wafer 11W and base wafer 12W are cut along the X-axis direction. Thus, the bonded-together lid wafer 11W and base wafer 12W are cut until separated along the second scribe line SL2, denoted by the dot-dash lines in FIGS. 5-7. Also, although the through-hole BH1 is not formed along the second scribe line SL2, the duration of the wafers being loaded will be shortened, since the lid wafer 11W and base wafer 12W are cut along the Z'-axis direction in step S17. This prevents damage to the base wafer 12W, such as the peeling of electrodes. After going through steps S17 and S18, several hundreds to several thousands of quartz-crystal vibrating devices 100 are produced from the bonded-together lid wafer 11W and base wafer 12W.

In step S17 and S18, the bonded-together lid wafer 11W and base wafer 12W are cut along the first edge L1, and the bonded-together lid wafer 11W and base wafer 12W are cut along the second edge L2. In order to minimize the duration of wafers being loaded during the cutting process, it is preferred to form the first edge L1 shorter than the second edge L2.

In step S19, the vibration frequency of the separate individual first quartz-crystal vibrating devices 100 is measured.

Second Embodiment

<Overall Configuration of Second Quartz-crystal Vibrating Device 200>

Figure 8:
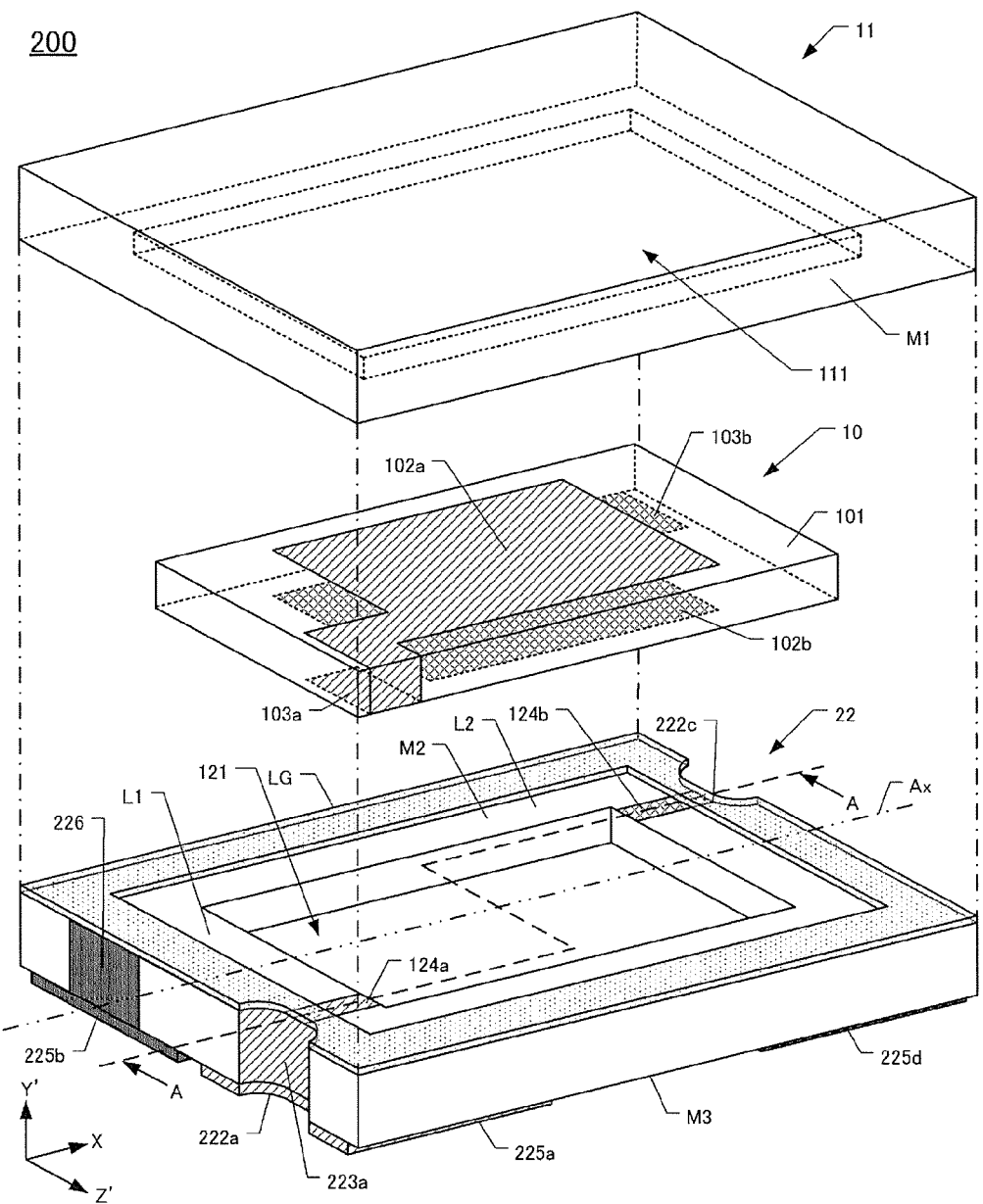
FIG. 8 is an exploded perspective view of a second quartz-crystal vibrating device 200.
Figure 9:
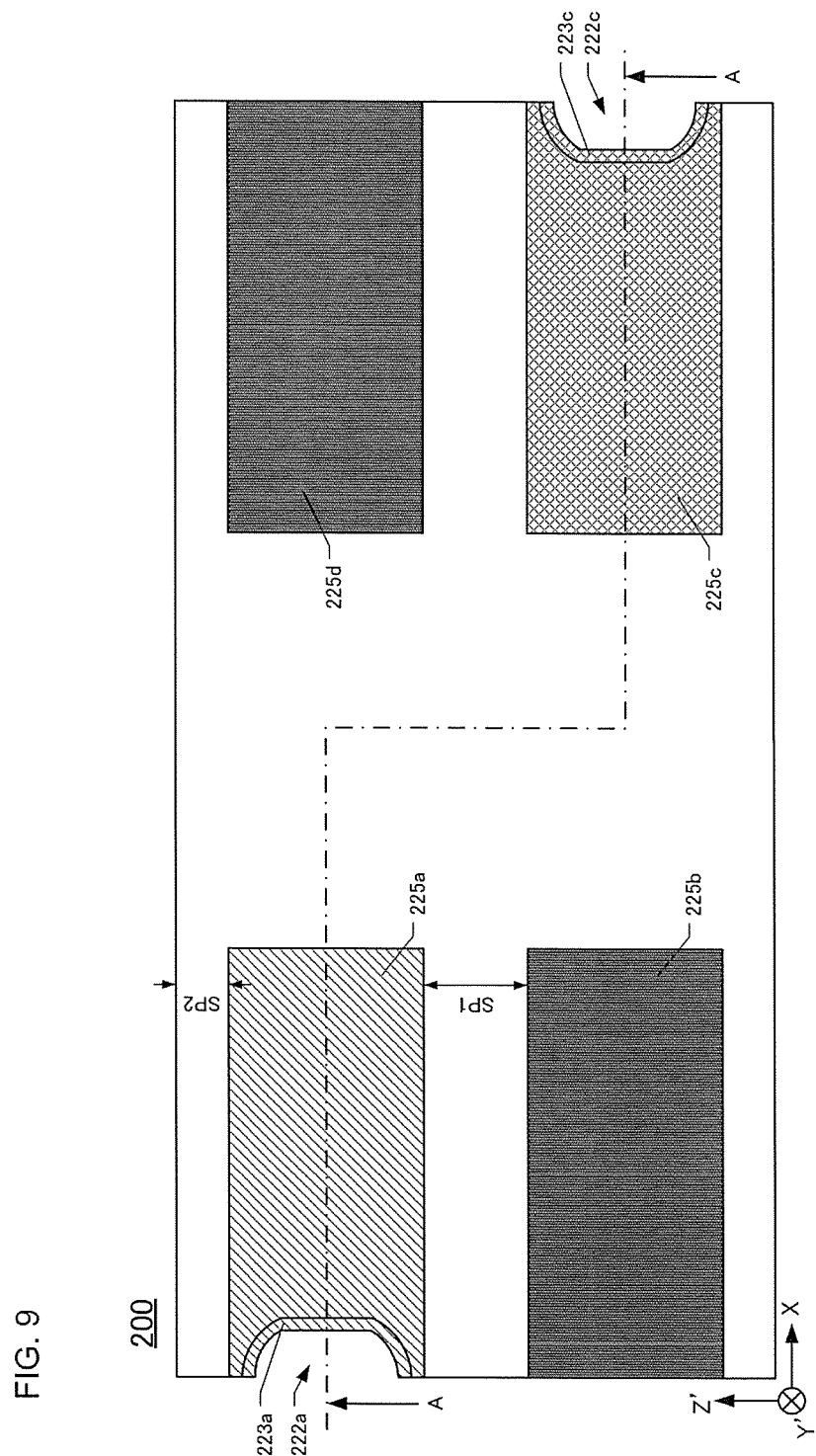
FIG. 9 is a plan view of the bottom surface of the second quartz-crystal vibrating device 200.

The overall configuration of the second embodiment of a quartz-crystal vibrating device 200 is described below with reference to FIGS. 8 and 9. FIG. 8 is an exploded perspective view of a second quartz-crystal vibrating device 200, and FIG. 9 is a plan view of the bottom surface of the second quartz-crystal vibrating device 200. In FIG. 8, low-melting-point glass LG used as a sealing material is shown as transparent, so that the entire connecting electrodes 124a and 124b can be viewed. In this embodiment, components that are similar to corresponding components of the first embodiment have the same respective reference numerals and are not described further below.

As shown in FIGS. 8, the second quartz-crystal vibrating device 200 comprises a package lid 11, a package base 22, and a planar quartz-crystal vibrating piece 10 mounted on the package base 22.

The package base 22 is fabricated from a glass or piezoelectric material, and comprises a second peripheral surface M2 on its principal surface (+Y'-axis side surface), circumscribing a base recess 121. The package base 22 has a rectangular profile, and comprises a pair of first edges L1 extending parallel to the Z'-axis direction and a pair of second edges L2 extending parallel to the X-axis direction. On the first edge L1 of the package base 22, a pair of castellations 222a, 222c is formed.

Specifically, a base castellation 222a is situated on the +Z'-axis side of the first edge L1 in the −X-axis direction, which was formed simultaneously with the formation of the base through-holes BH2 (see FIGS. 10 and 11), and extend in the Z'-axis direction. Thus, the base castellation 222a is situated on the +Z'-axis region of the axis Ax. Similarly, a base castellation 222c is situated on the −Z'-axis side of the first edge L1 in the +X-axis direction, which was formed simultaneously with the formation of the base through-holes BH2 (see FIGS. 10 and 11), and extend in the Z'-axis direction. Thus, the base castellation 222c is situated on the −Z'-axis region of the axis Ax. Preferably, the base castellations 222a and 222c, and the base castellations 222b and 222d are situated point-symmetrically to the center point of the package base 22. Respective base edge-surface electrodes 223a, 223c are formed on the base castellations 222a, 222c (see FIG. 9).

As shown in FIG. 9, on the mounting surface M3 of the package base 22 are a pair of external electrodes 225a, 225c that are electrically connected to the respective base edge-surface electrodes 223a, 223c, and a pair of grounding electrodes 225b, 225d for grounding. On the package base 22, the external electrodes 225a, 225c are electrically connected to the base edge-surface electrodes 223a, 223c that are formed simultaneously with the base castellations 222a, 222c. Castellations are not formed on the grounding electrodes 225b and 225d.

Referring further to FIG. 9, the pair of external electrodes 225a, 225c and the pair of grounding electrodes 225b, 225d are situated apart from each other. The external electrode 225a and the grounding electrode 225d are situated apart from the second edge L2 in the +Z'-axis direction of the package base 22 (see FIG. 8). The grounding electrode 225b and the external electrode 225c are situated apart from the second edge L2 in the −Z'-axis direction of the package base 22 (see FIG. 8).

In the second embodiment, although a pair of grounding electrodes 225b, 225d is formed in combination with the pair of external electrodes 225a, 225c, grounding electrodes 225b, 225d does not need to be formed.

<Method for Manufacturing the Second Quartz-crystal Vibrating Device 200>

Figure 10:
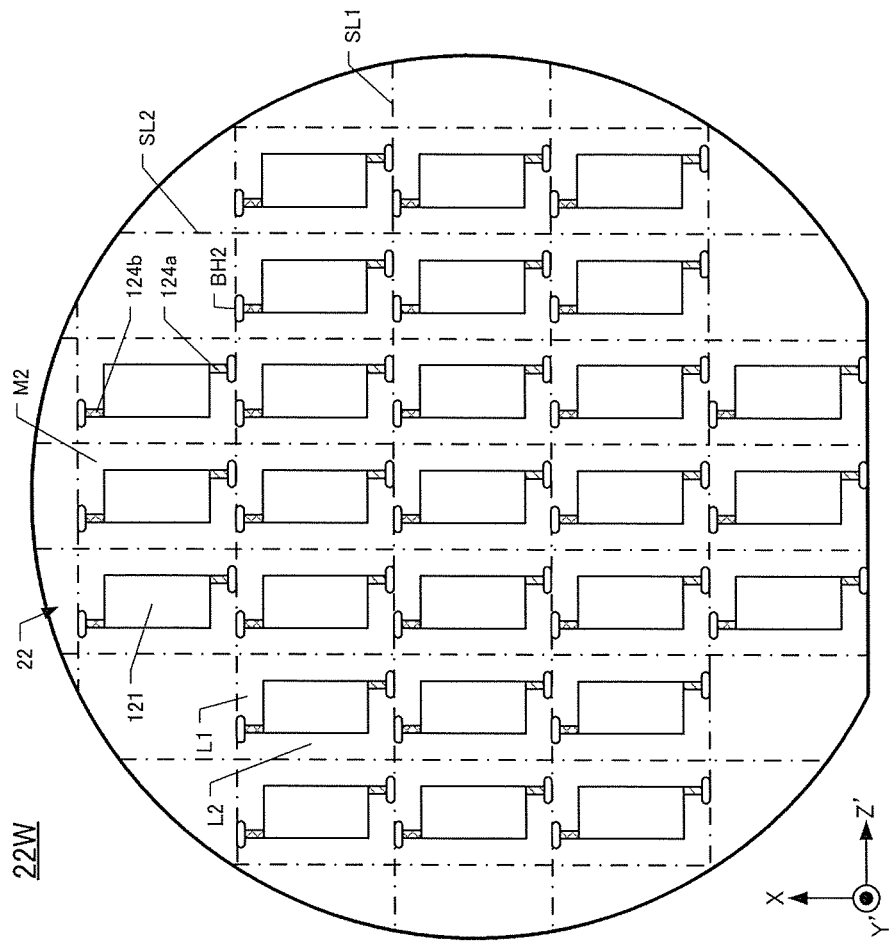
FIG. 10 is a plan view of a base wafer 22W.

The method for manufacturing the second embodiment of a quartz-crystal vibrating device 200 essentially follows the flow-chart in FIG. 3 diagramming the method for manufacturing the first embodiment of a quartz-crystal vibrating device 100. However, during the formation of the package bases 22 on the base wafer 22W, the shape of the through-holes BH2 differ from the previous embodiment. FIG. 10 is a plan view of a base wafer 22W, and FIG. 11 is a plan view of the bottom surface of the base wafer 22W.

As shown in FIG. 10, in the second quartz-crystal vibrating device 200, a pair of through-holes BH2 are formed along the −Z'-axis side of the first edge L1 in the +X-axis direction, and along the +Z'-axis side of the first edge L1 in the −X-axis direction. Thus, the adjacent through-holes BH2 in the Z'-axis direction are situated alternatively on both sides of the second scribe line SL2.

Thus, in step S17 of FIG. 3, when the base wafer 22W is cut along the first scribe line SL1, the metal film 226 may form on the first edge L1 of the package base 22 (see FIG. 8). Specifically, as shown in FIGS. 8 and 9, the metal films 226 are formed on the −Z'-axis side of the base castellation 222a of the first edge L1 in the −X-axis direction and on the +Z'-axis side of the base castellation 222c of the first edge L1 in the +X-axis direction, and are connected to the respective grounding electrodes 225b, 225d.

Figure 11:
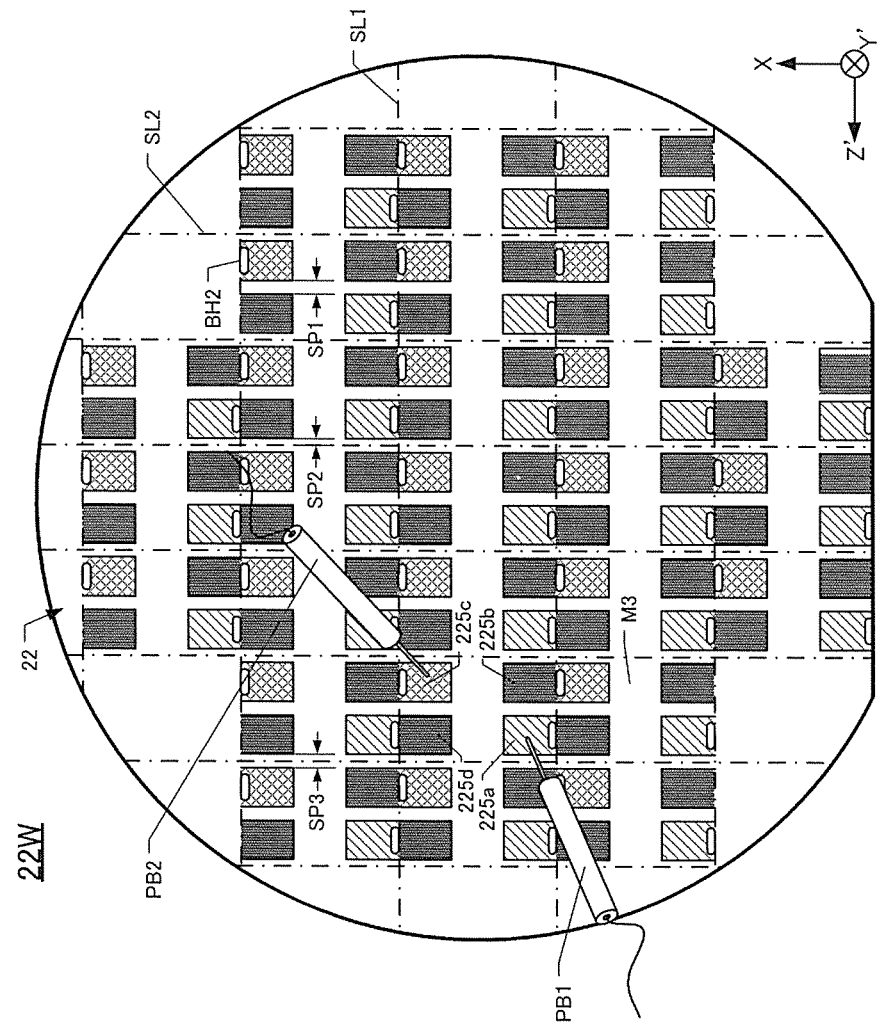
FIG. 11 is a plan view of the bottom surface of the base wafer 22W.

As shown in FIG. 11, vibration frequencies of individual quartz-crystal vibrating pieces 10 can be measured by contacting a pair of probes PB1, PB2 for measuring vibrating frequency to a pair of external electrodes 225a, 225c on the package base 22 (see FIG. 8). Measuring method is the same as explained in step S14 of FIG. 3, and further explanations are omitted.

Furthermore, during the cutting step for separating the bonded-together lid wafer 11W and base wafer 22W into individual second quartz-crystal vibrating devices 200, cuts are made along the first scribe line SL1 where the through-holes BH2 are formed. Then, the bonded-together lid wafer 11W and base wafer 22W are cut along the scribe line SL2 where the through-holes BH2 are not formed.

According to this cutting process, the duration of load onto the lid wafer 11W and base wafer 22W during cutting process can be shortened. Accordingly, damage to the base wafer 22W, such as peeling of electrodes, is prevented.

Third Embodiment
<Overall Configuration of Third Quartz-crystal Vibrating Device 300>

Figure 12:
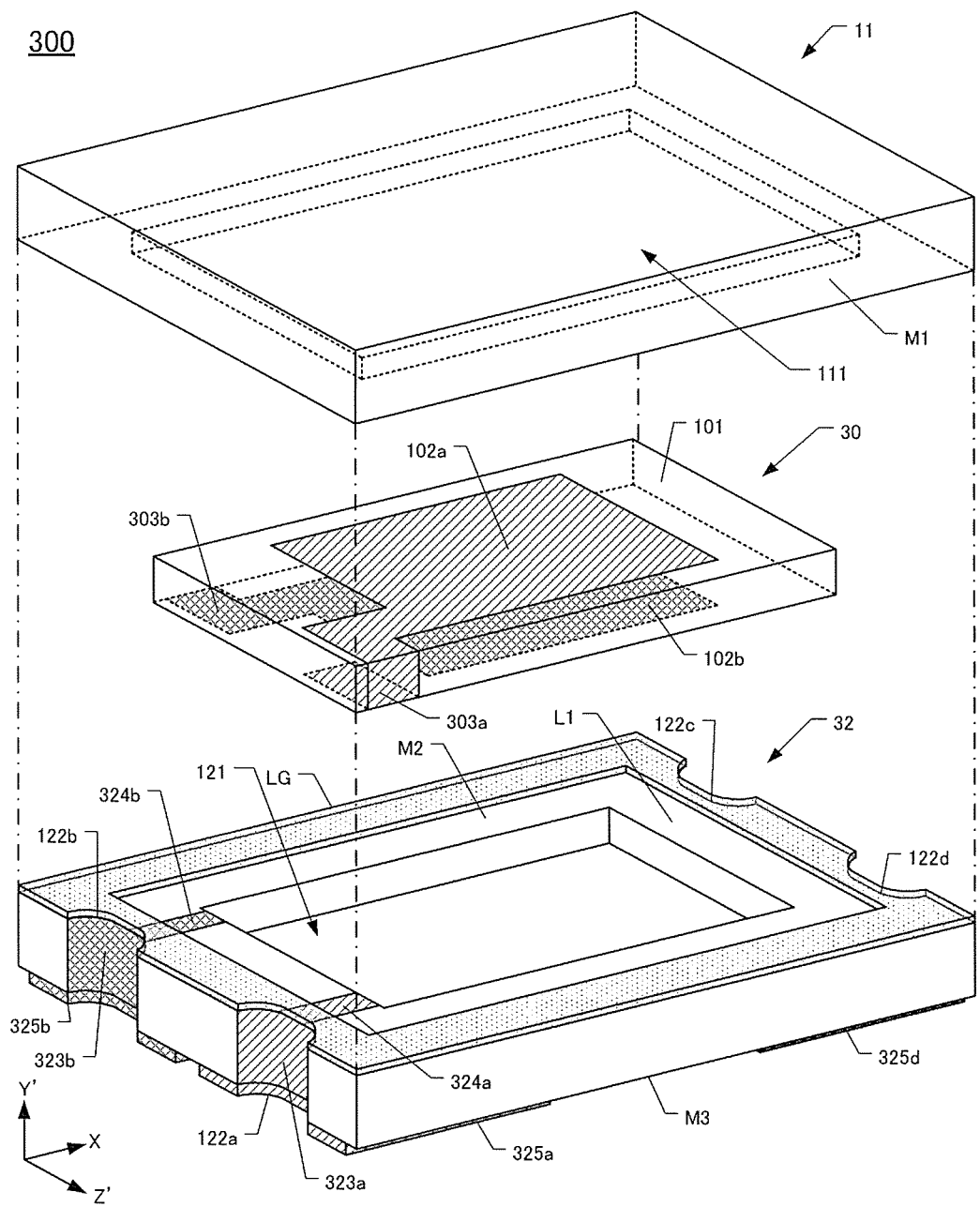
FIG. 12 is an exploded perspective view of a second quartz-crystal vibrating device 300.
Figure 13:
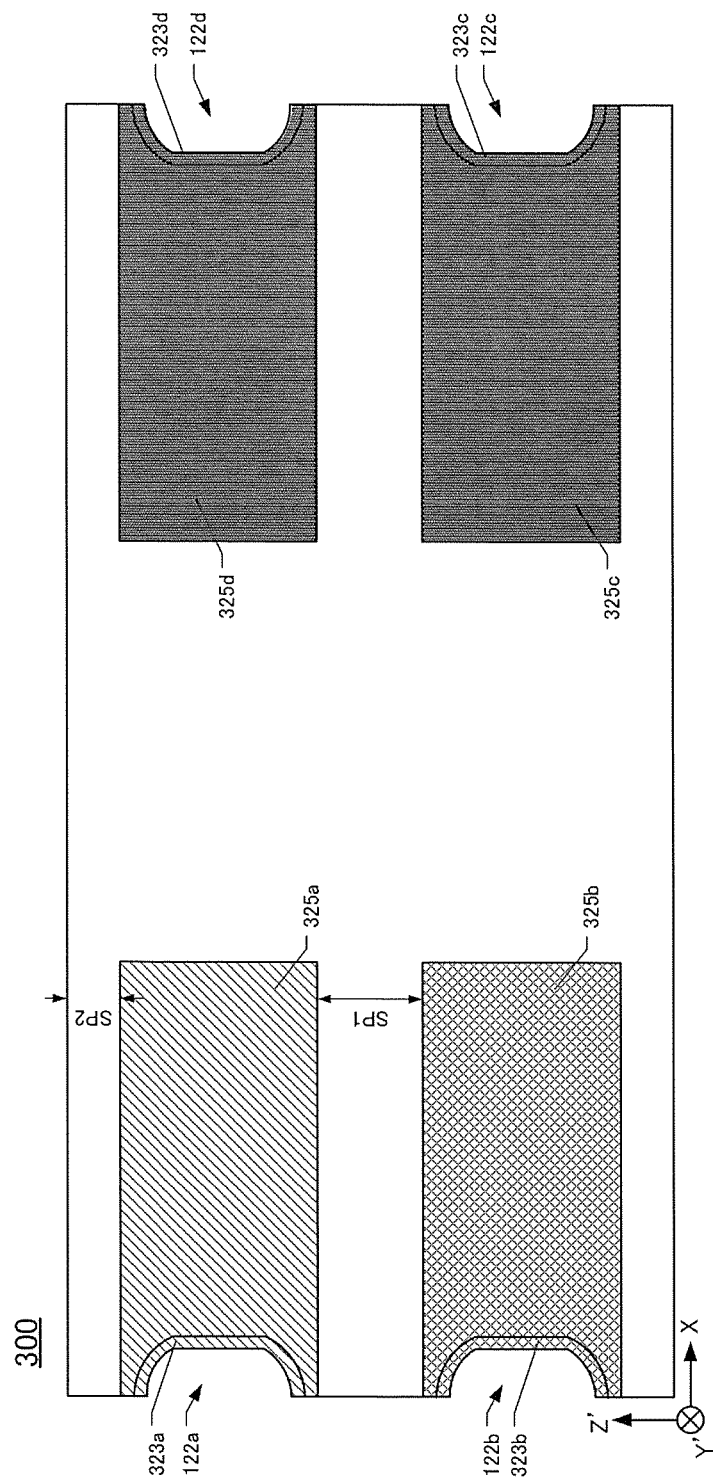
FIG. 13 is a plan view of the bottom surface of the second quartz-crystal vibrating device 300.

The overall configuration of the third embodiment of a quartz-crystal vibrating device 300 is described below with reference to FIGS. 12 and 13. FIG. 12 is an exploded perspective view of a third quartz-crystal vibrating device 300, and FIG. 13 is a plan view of the bottom surface of the second quartz-crystal vibrating device 300. In FIG. 12, low-melting-point glass LG used as a sealing material is shown as transparent, so that the entire connecting electrodes 324a and 324b can be viewed. In this embodiment, components that are similar to corresponding components of the first embodiment have the same respective reference numerals and are not described further below.

As shown in FIGS. 12 and 13, the third quartz-crystal vibrating device 300 comprises a package lid 11, a package base 32, and a planar quartz-crystal vibrating piece 30. The quartz-crystal vibrating piece 30 is mounted to the package base 32.

The quartz-crystal vibrating piece 30 comprises an AT-cut quartz-crystal piece 101. A pair of excitation electrodes 102a, 102b is situated substantially in the center of the quartz-crystal piece 101, in which the electrodes are oppose to each other. The excitation electrode 102a is connected to an extraction electrode 303a, extending in the −X-axis direction, and to the bottom surface (+Z'-axis surface) of the quartz-crystal piece 101. The excitation electrode 102b is connected to an extraction electrode 303b, extending in the −X-axis direction, to the bottom surface (−Z'-axis side surface) of the quartz-crystal piece 101. The shape of the extraction electrode on the vibrating piece 30 is different from the shape of the extraction electrode on the vibrating piece 10 in the first embodiment.

Figure 14:
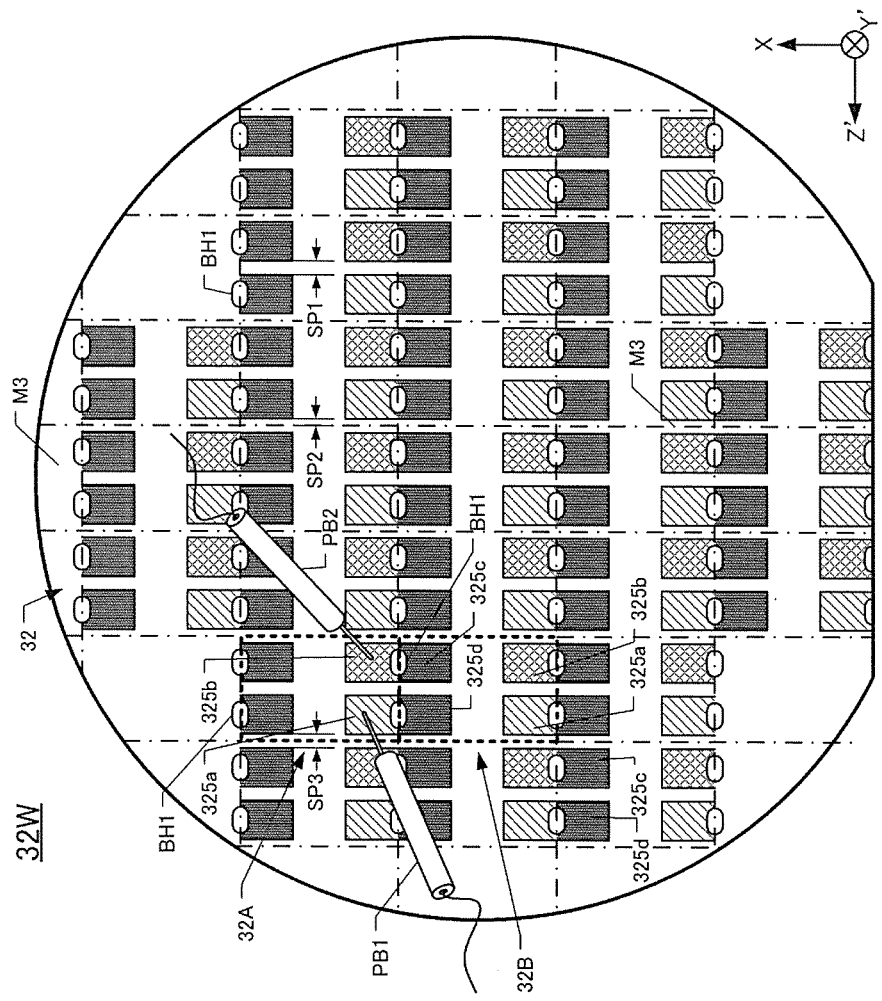
FIG. 14 is a plan view of the bottom surface of a base wafer 32W.

On the pair of first edges L1 of the package base 32 extending in the X-axis direction, four base castellations 122a-122d are situated (see FIG. 14). The base castellations 122a and 122b are situated symmetrically to the axis Ax that passes through the centerline of the package base and is parallel with the second edge L2. Thus, the base castellations 122a and 122b are situated symmetrically to an axis Ax and along the Z'-axis direction. Similarly, the base castellations 122c and 122d are situated symmetricallt to the axis Ax that passes through the centerline of the package base and is parallel to the second edge L2. Thus, the base castellations 122c and 122d are situated symmetrically to an axis Ax and along the Z'-axis direction. Also, respective base edge-surface electrodes 323a-323d are situated on the respective base castellations 122a-122d.

Connecting electrodes 324a, 324b, formed on the second peripheral surface M2, are connected to the respective base edge-surface electrodes 323a, 323b on the −X-axis direction of the package base 32, aligned with the quartz-crystal vibrating piece 30. A pair of external electrodes 325a, 325b connected to the respective base edge-surface electrodes 323a, 323b is formed on the mounting surface M3 of the package base 32 in the -X-axis direction. Base edge-surface electrodes 323c, 323d formed on the mounting surface M3 of the package base 32 in the +X-axis direction are connected to respective grounding electrodes 325c, 325d situated on the mounting surface M3 of the package base 32 in the +X-axis direction.

As shown in FIG. 13, the external electrodes 325a, 325b and grounding electrodes 325c, 325d are situated apart from each other. The respective external electrodes 325a, 325b and the respective grounding electrodes 325c, 325d are separated by a space SP1. The space SP1 is in the range of 200 μm to 500 μm in the Z'-axis direction, for example. The external electrode 325a and the grounding electrode 325d are situated apart from the second edge-surface L2 of the package base 32 in the +Z'-axis direction. Similarly, the external electrode 325b and the grounding electrode 325c are situated apart from the second edge-surface L2 of the package base 32 in the −Z′-axis direction. The external electrode 325a or the grounding electrode 325d and the second edge L2 of the package base 32 in the +Z-axis direction, and the external electrode 325b or the grounding electrode 325c and the second edge L2 of the package base 32 in the −Z-axis direction are separated by a space SP2. The space SP2 is in the range of 0 µm to 100 µm in the Z′-axis direction, for example.

<Method for Manufacturing a Third Quartz-crystal Vibrating Device 300>

The method for manufacturing a third quartz-crystal vibrating device 300 essentially follows the exemplary process steps of the flow-chart in FIG. 3 diagramming the method for manufacturing the first embodiment of a quartz-crystal vibrating device 100. However, as shown in FIG. 14, during the formation of the package bases 32 on the base wafer 32W, the respective positions of the external electrodes and the grounding electrodes differ from the corresponding positions in the first embodiment.

FIG. 14 is a plan view of the bottom surface of a base wafer 32W, on which a plurality of package bases 32 are manufactured simultaneously. The external electrode 325a and the grounding electrode 325d, formed on adjacent package bases 32A, 32B in the X-axis direction, are formed as one unit. Similarly, the external electrode 325b and the grounding electrode 325c are formed as one unit. The mounting terminals (external electrodes and grounding electrodes) formed in the adjacent Z′-axis directions are formed apart from each other, and the space SP3 in the Z′-axis direction is in the range of approximately 40 µm to 280 µm.

Hence, whenever probes PB1, PB2 for measuring vibration frequency are in contact with the external electrodes 325a, 325b on the package base 32A, the vibration frequency of each quartz-crystal vibrating piece 30 is measured. Even if an alternating voltage is applied from the probes PB1, PB2 to the external electrodes 325a, 325b on the package base 32A, the external electrodes 325a, 325b only connect to the grounding electrodes 325c, 325d on the package base 32B without making electrical connection to the quartz-crystal vibrating piece 30 on the package base 32B. Therefore, the vibration frequency of the quartz-crystal vibrating piece 30 on the package base 32 can be measured accurately at the wafer level before dicing.

Furthermore, during the cutting step for separating the bonded-together lid wafer 11W and base wafer 32W into individual third quartz-crystal vibrating devices 300, cuts are made along the first scribe line SL1 where the first through-holes BH1 are formed. Then, the bonded-together lid wafer 11W and base wafer 32W are cut along the second scribe line SL2 where the second through-holes BH1 are not formed.

According to this cutting process, duration of loading onto the base wafer 32W during cutting process can be shortened. Accordingly, damage to the base wafer 32W, such as peeling of electrodes, is prevented.

Fourth Embodiment

<Overall Configuration of a Fourth Quartz-crystal Vibrating Device 400>

Figure 15:
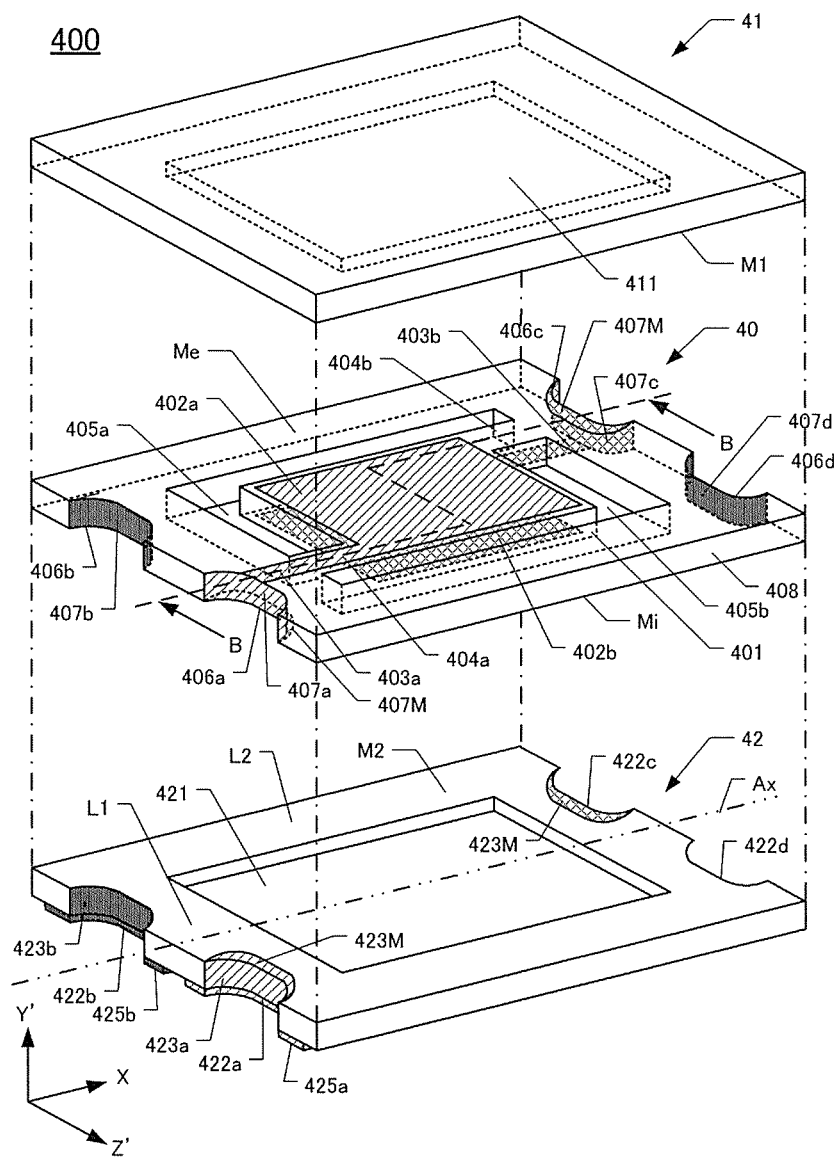
FIG. 15 is an exploded perspective view of a vibrating device 400.

The general configuration of the fourth embodiment of a quartz-crystal vibrating device 400 is described below with reference to FIGS. 15 and 16. FIG. 15 is an exploded perspective view of a vibrating device 400, and FIG. 16 is a cross-sectional view along the line B-B in FIG. 15.

Figure 16:
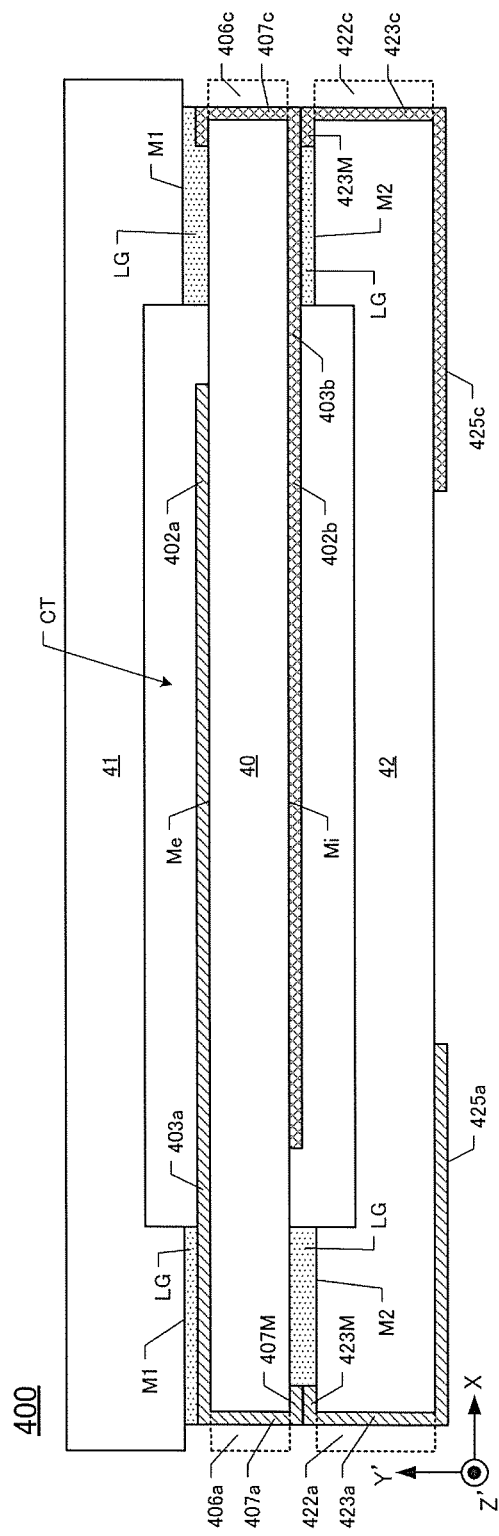
FIG. 16 is a cross-sectional view along the line B-B in FIG. 15.

As shown in FIGS. 15 and 16, the fourth quartz-crystal vibrating device 400 comprises a package lid 41 (defining a lid recess 411), a package base 42 (defining a base recess 421), and a quartz-crystal vibrating piece 40 sandwiched between the package lid 41 and the package base 42.

The quartz-crystal vibrating piece 40 comprises a quartz-crystal vibrating portion 401 including respective excitation electrodes 402a, 402b on each main surface thereof An outer frame 408 surrounds the quartz-crystal vibrating portion 401. Between the vibrating portion 401 and the outer frame 408 are respective supporting portions 404a, 404b extending from the vibrating portion 401 along both edges in the X-axis directions. This leaves a pair of L-shaped slots 405a, 405b situated between the vibrating portion 401 and the outer frame 408. Rounded-rectangular quartz-crystal castellations 406a-406d are situated on respective edges of the vibrating piece 40 in respective X-axis directions and extending in the Z′-axis directions. Two castellations are formed on each edge. These castellations were originally formed as rounded-rectangular through-holes CH (refer to FIG. 17). Respective quartz-crystal edge-surface electrodes 407a-407d is formed on each quartz-crystal castellation 406a-406d.

An extraction electrode 403a is formed on the first surface Me of the supporting portion 404a, which connects one edge of the vibrating piece 40 in the -X-axis direction to the quartz-crystal edge-surface electrode 407a formed on the other edge in the +Z-axis direction. The quartz-crystal edge-surface electrode 407a desirably extends to the second surface Mi of the vibrating piece 40 and connects to the connecting pad 407M. The connecting pad 407M is electrically connected to the connecting pads 423M of the base edge-surface electrode 423a, which is described later below. Similarly, on the second surface Mi of the joining portion 404b, an extraction electrode 403b connects the respective excitation electrode 402b to the quartz-crystal edge-surface electrode 407c on the vibrating piece 40 in the +X-axis direction and on the -Z-axis side surface. The extraction electrode 403b is electrically connected to the connecting pad 423M of the base edge-surface electrode 423c, which is described later below.

The package base 42 has a rectangular profile having a pair of first edges L1 extending in the Z′-axis direction and a pair of second edge L2 extending in the X-axis direction. The package base 42 is fabricated from glass or a quartz-crystal material, and comprises a second peripheral surface M2 on its principal surface (+Y′-axis surface) surrounding the base recess 421. Respective base castellations 422a-422d, two castellations on each edge are formed on both edges of the package base 42 in the X-axis directions. These castellations were originally formed as base through-holes BH1 (FIGS. 6 and 7). Specifically, the base castellations 422a, 422b are situated on the -X-axis direction, and the base castellations 422c, 422d are situated on the +X-axis direction. The base castellations 422a, 422b and the base castellations 422c, 422d are situated symmetrically to the axis Ax that passes through the centerline of the package base and are parallel to the second edge L2. Preferably, the base castellations 422a and 422c, and the base castellations 422b and 422d are situated point-symmetrically to the center point of the package base 42.

Respective base edge-surface electrodes 423a-423d are formed on the base castellations 422a-422d. The base edge-surface electrode 423a, situated on the package base 42 in the −X-axis direction of the first edge L1 and on the +Z′-axis side, is connected to the connecting pad 407M situated on the vibrating piece 40 via the connecting pad 423M on the second peripheral surface M2. Thus, the base edge-surface electrode 423a is connected to the extraction electrode 403a via the connecting pad 407M and the quartz-crystal edge-surface electrode 407a. Also, the base edge-surface electrode 423c situated on the package base 42 in the +X-axis side of the first edge L1 and on the −Z′-axis direction is connected to the extraction electrode 403b on the vibrating piece 40.

On the package base 42, two external electrodes 425a, 425c, and two grounding electrodes 425b, 425d are configured diagonally from each other on the mounting surface M3 (see FIG. 2B). Each external electrode 425a, 425c is connected to the respective base edge-surface electrode 423a, 423c that is connected to the respective extraction electrode 403a, 403b on the vibrating piece 40. Each grounding electrode 425b, 425d is connected to the respective base edge-surface electrodes 423b, 423d.

As shown in FIG. 16, the package lid 41, the outer frame 408, and the package base 42 bonded together define a cavity CT in which the quartz-crystal vibrating piece 40 is situated. The package lid 41, the vibrating piece 40, and the package base 42 are sealed together using a sealing material of, for example, low-melting-point glass.

The fourth embodiment is similar to the first embodiment in that a pair of external electrodes and a pair of grounding electrodes are situated diagonally from each other on the mounting surface of the vibrating device 400. The fourth embodiment is also similar to the second embodiment and that a pair of external electrodes and a pair of grounding electrodes are situated on one side. Furthermore, as explained in the second embodiment, the third embodiment may lack castellations corresponding to a pair of grounding electrodes.

<Method for Manufacturing a Fourth Quartz-crystal Vibrating Device 400>

Figure 17:
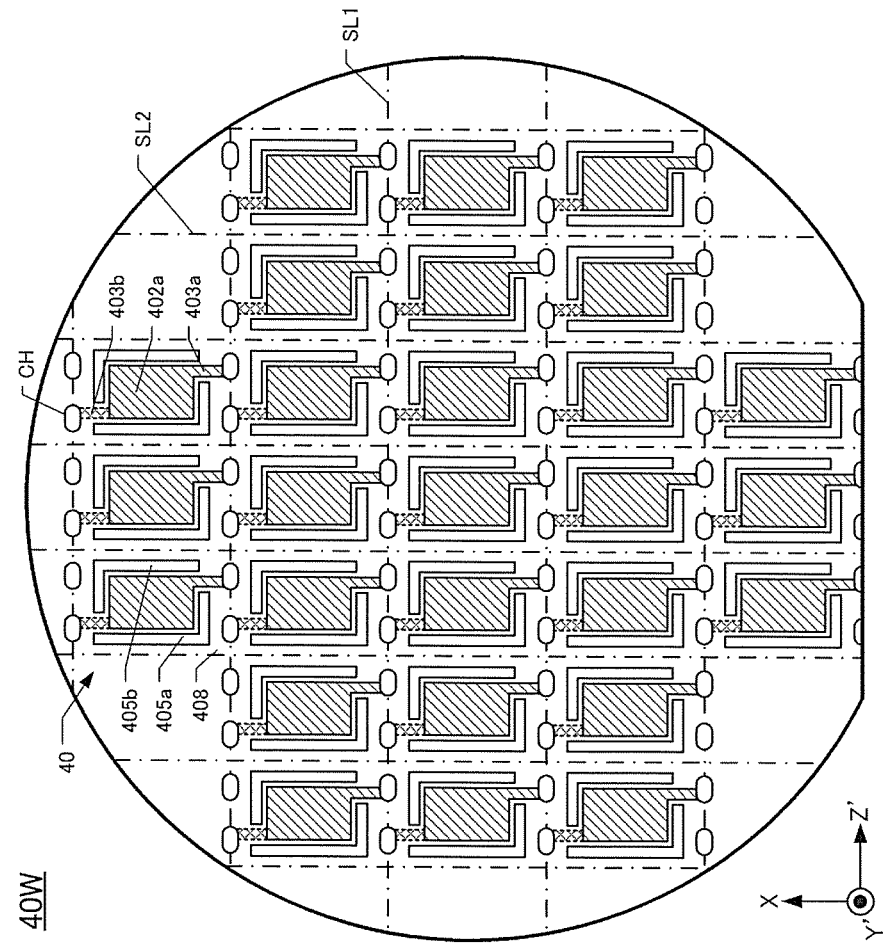
FIG. 17 is a plan view of a base wafer 40W.

This method for manufacturing the fourth embodiment of a quartz-crystal vibrating device 400 essentially follows the exemplary process steps in the flow-chart in FIG. 3. FIG. 17 is a plan view of a base wafer 40W from which a plurality of quartz-crystal vibrating pieces 40 can be made.

In step S101 (FIG. 17), the profile outlines of a plurality of quartz-crystal vibrating pieces 40 are formed on the planar quartz-crystal wafer 40W by etching. A quartz-crystal vibrating portion 401, an outer frame 408, and a pair of slots 405a, 405b are thereby formed. On respective edges of each vibrating piece 40 in the X-axis directions, two quartz-crystal through-holes CH are formed simultaneously. The through-holes CH extend depthwise through the wafer 40W. Whenever the quartz-crystal through-holes CH are cut in half during dicing, they forms the respective castellations 406a-406d (FIG. 15).

In step S11, a plurality of package lids 41 is manufactured. Manufacturing method of the package lid 41 is same as described in the first embodiment.

In protocol S12, multiple package bases 42 are manufactured. Protocol S12 includes steps S121-S123. Comparing to the first embodiment, the pair of connecting pads 423M is formed on the second peripheral surface M2 (see FIG. 15) instead of the pair of connecting electrodes 124a, 124b (see FIG. 6).

In step S13, the quartz-crystal wafer having multiple quartz-crystal vibrating pieces 40 manufactured in step S10 is bonded to the base wafer having multiple package bases 42 using the low-melting-point glass LG. During the bonding, the connecting pad 407M on the quartz-crystal wafer 40W is bonded to the connecting pad 423M on the base wafer, and the extraction electrode 403b on the quartz-crystal wafer 40W is bonded to the connecting pad 423M on the base wafer.

In step S14, probes PB1, PB2 for measuring vibration frequency are contacted to respective external electrodes 425a, 425c on the same package base 42. Thus, the vibration frequency of each vibrating portion 401 is measured. Even if an alternating voltage is applied to the external electrodes 425a, 425c, the external electrodes 425a, 425c only connect to the adjacent grounding electrodes 425b, 425d on the package base 42 and do not electrically connect to the external electrodes 425a, 425c. Hence, the vibration frequency of the vibrating portion 401 can be measured accurately at the wafer level before dicing.

In step S15, as shown in the first embodiment, the thickness of the excitation electrode 402a of the vibrating portion 401 is adjusted.

In step T16 the applied low-melting-point glass LG is heated as the lid wafer and base wafer are compressed against each other. Thus, the lid wafer and the base wafer are bonded together by the low-melting-point glass LG.

In step T17 the bonded-together lid wafer 41W, the crystal wafer 40W (see FIG. 17) and the base wafer 42W (see FIGS. 6 and 7) is cut up into separate individual pieces along the Z'-axis direction. This cutting is performed by using a dicing unit such as a laser beam or a dicing saw. In step S17, the bonded-together lid wafer 41W, the quartz-crystal wafer 40W and the base wafer 42W are cut until separated along the scribe line SL1, denoted by dot-dash lines in FIGS. 5-7 and 17. Thus, the lid wafer 41W and base wafer 42W are cut until separated along the first edge L1, which the base through-holes BH1, CH are formed. Here, since no load is applied onto the quartz-crystal wafer and base wafer 42W whenever the dicing unit passes through the through-hole BH1 CH, the duration of the wafers being loaded will be shortened. Accordingly, damage to the quartz-crystal wafer and base wafer 42W, such as peeling of electrodes, is prevented.

In step S18 the bonded-together lid wafer 41W (see FIG. 5), quartz-crystal wafer 40W (see FIG. 17) and base wafer 42W (see FIGS. 6 and 7) are cut along the X-axis direction. Thus, the bonded-together lid wafer 41W, quartz-crystal wafer 40W and base wafer 42W are cut until separated along the second scribe line SL2, denoted by dot-dash lines in FIGS. 5-7 and 17. Also, although the through-holes BH1, CH are not formed along the second scribe line SL2, the duration of the wafers being loaded will be shortened, since the lid wafer 41W, quartz-crystal wafer 40W and base wafer 42W are cut along the Z'-axis direction in step S17. Accordingly, damage to the quartz-crystal wafer 40W and base wafer 42W, such as peeling of electrodes, is prevented. After going through steps S17 and S18, several hundreds to several thousands of quartz-crystal vibrating devices 400 are produced from the bonded-together lid wafer 41W, quartz-crystal wafer 40W and base wafer 42W.

In step S19, vibration frequency of the separate individual first quartz-crystal vibrating devices 400 is measured.

In step S12 of the third embodiment, the base edge-surface electrodes 423a-423d, external electrodes 425a, 425c and grounding electrodes 425b, 425d are formed on the package base 42. Then, in step S13, the quartz-crystal wafer and base wafer are bonded together. However, after bonding the quartz-crystal wafer and the base wafer (lacking electrodes) together, respective base edge-surface electrodes 423a-423d, external electrodes 425a, 425c, and grounding electrodes 425b, 425b can be formed by sputtering. Thus, the connecting pad 423M on the package base 42, shown in FIGS. 15 and 16, needs not be formed. This manufacturing method can be also applied to the alternative configuration to fourth embodiment, as described below.

Alternative Configuration to Fourth Embodiment

<Overall Configuration of Fourth Quartz-crystal Vibrating Device 400'>

Figure 18A:
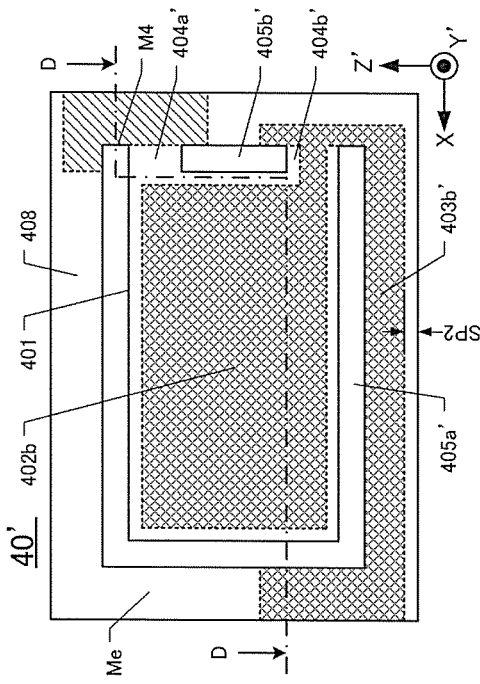
FIG. 18A is a plan view of a quartz-crystal vibrating piece 40' viewed from its +Y'-axis side.
Figure 18B:
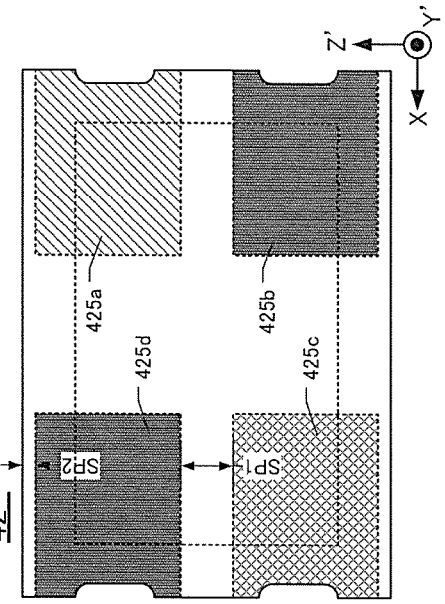
FIG. 18B is a perspective view of the vibrating piece 40' viewed from its +Y'-axis side.
Figure 18C:
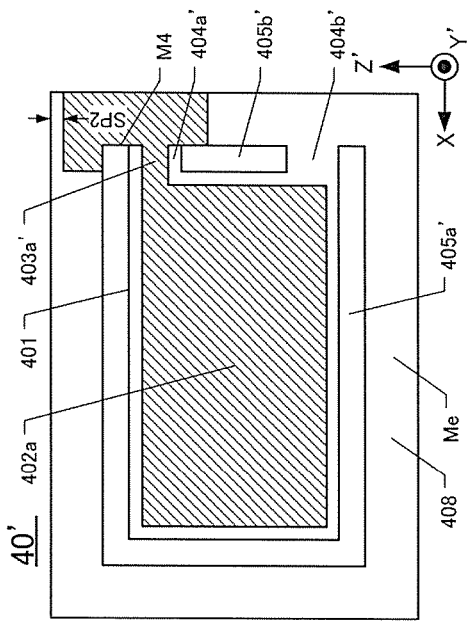
FIG. 18C is a plan view of a package base 42' viewed from its +Y'-axis side.
Figure 18D:
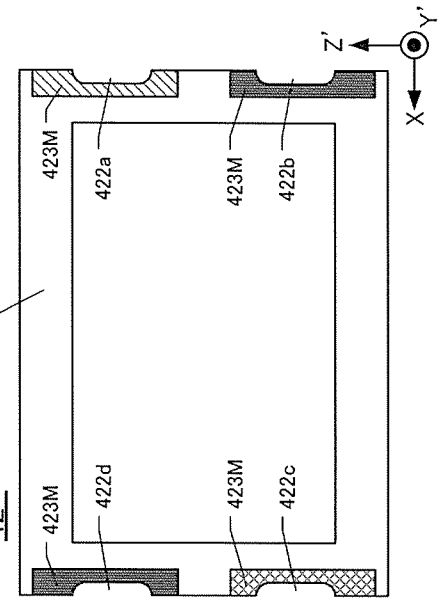
FIG. 18D is a perspective view of the package base 42' viewed from its +Y'-axis side.
Figure 20A:
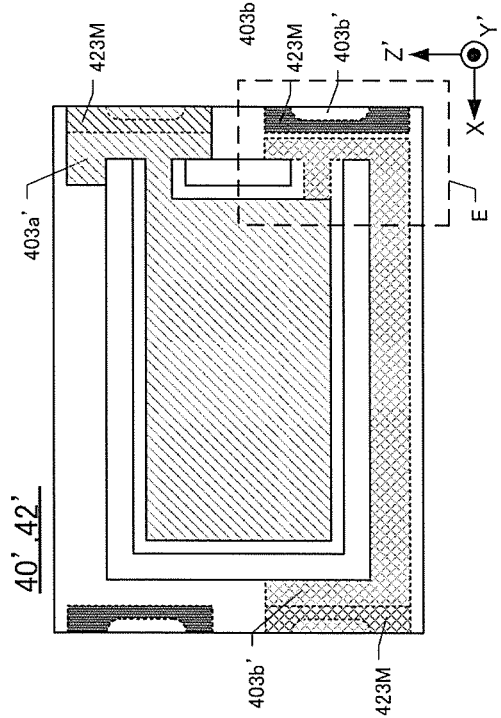
FIG. 20A is a plan view of an alternative configuration 400' viewed from its +Y'-axis side.

The general features of this alternative configuration 400' of the fourth embodiment of a quartz-crystal vibrating device 400 are described with reference to FIGS. 18-20A. FIG. 18A is a plan view of the quartz-crystal vibrating piece 40' viewed from its +Y'-axis side. FIG. 18B is a perspective view of the vibrating piece 40' viewed from its +Y'-axis side. FIG. 18C is a plan view of the package base 42' viewed from its +Y'-axis side. FIG. 18D is a perspective view of the package base 42' viewed from its +Y'-axis side. FIG. 19 is a cross-sectional view along the line D-D in FIG. 18B. FIG. 20A is a plan view of the alternative configuration 400' viewed from its +Y'-axis side. In FIG. 20A, the package lid 31 is not shown. Also, in FIG. 20A and 20B, the vibrating piece 40' is shown as transparent so that the package base 42' can be viewed.

As shown in FIGS. 18A and 18B, the quartz-crystal vibrating piece 40' of the fourth embodiment of a quartz-crystal vibrating device 400' does not have a quartz-crystal castellations. The quartz-crystal vibrating piece 40' comprises a quartz-crystal vibrating portion 401 including respective excitation electrodes 402*a*, 402*b* on both principal surfaces thereof and the outer frame 408 surrounding the quartz-crystal vibrating portion 401. Between the vibrating portion 401 and the outer frame 408, a pair of supporting portions 404*a'*, 404*b'* is situated. The supporting arms extend from the vibrating portion 401 in the −X-axis direction. Thus, between the vibrating portion 401 and the outer frame 408, a rectangular slot 405*a'* is defined that extends in the −X-axis direction. Also, between the supporting portion 404*a'*, 404*b'*, a rectangular slot 405*b'* is defined.

In FIG. 19, the extraction electrode 403*a'*, formed on the first surface Me of the vibrating piece 40' and connected to the excitation electrode 402*a*, extends completely from the first surface Me to the second surface Mi of the vibrating piece 40' via the edge surface M4 on the slot 405*a'*.

Returning to FIGS. 18A and 18B, the extraction electrode 403*a'* (on the vibrating piece 40' and extending to the second surface Mi) is formed on one corner of the vibrating piece 30' on the +Z'-axis side and in the −X-axis direction. Since multiple quartz-crystal vibrating pieces 40' are manufactured on a wafer, the extraction electrode 403*a'* is situated with a space SP1 away from one edge of the vibrating piece 40' in the +Z'-axis side, so as to prevent the extraction electrode 403*a'* from adversely affecting the adjacent quartz-crystal vibrating piece 40'.

The extraction electrode 403*b'* on the second surface Mi of the vibrating piece 40' extends from the quartz-crystal vibrating portion 401 in the −X-axis direction and is formed on one corner of the vibrating piece 40' on the −Z'-axis side and in the +X-axis direction. Since multiple quartz-crystal vibrating pieces 40' are manufactured on a wafer, the extraction electrode 403*b'* is situated with a space SP1 away from one edge of the vibrating piece 40' on the −Z'-axis side, so as to prevent the extraction electrode 403*b'* from adversely affecting the adjacent quartz-crystal vibrating piece 40'.

Referring now to FIGS. 18C and 18D, the package base 42' in this alternative configuration is essentially similar to the package base 42 in the third embodiment. However, in this alternative configuration, the base edge-surface electrodes 423*b*, 423*d* (see FIG. 15) connected to the grounding electrodes 425*b*, 425*d* extend to the second peripheral surface M2 of the package base 42', thus forming the connecting pad 423M.

Also, as shown in FIG. 20A, the package lid 41 (see FIG. 15), the vibrating piece 40', and the package base 42' are bonded together, which simultaneously bonds the extraction electrodes 403*a'*, 403*b'* of the vibrating piece 40' to the external electrodes 425*a*, 425*c* of the connecting pad 423M. Thus, the respective external electrodes 425*a*, 425*c* of the package base 42' are connected to the respective excitation electrodes 402*a*, 402*b* of the vibrating piece 40'.

Preferably, the extraction electrode 403*b'* on the second surface Mi (and extending through the outer frame 408), and the connecting pad 423M formed on the second peripheral surface M2 (and connected to the base castellation 422*b*) are formed being separate from the connecting pad 423M. This is because, whenever multiple package bases 42' are formed on a wafer, the grounding electrode 425*b* (connected to the base castellation 422*b*) is connected to the external electrode 425*c* of the adjacent package base 42' (see FIG. 7).

Figure 20B:
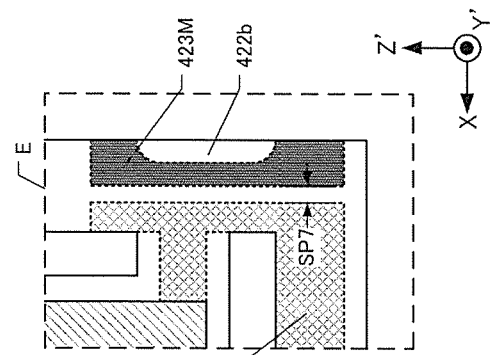

Therefore, as shown in FIG. 20B, it is desired to form the extraction electrode 403*b'* separately from the connecting pad 423M (connected to the base castellation 422*b* by a space SP7 in the X-axis direction). The space SP7 is approximately 10 μm wide.

In FIG. 20A and 20B, although the extraction electrode 403*b'* and the connecting pad 423M on the −X-axis direction are placed apart from each other in the X-axis directions, these features do not need to be formed apart. Thus, the space SP7 in the X-axis direction shown in FIG. 20A and 20B need not be formed if the extraction electrode 403*b'* and the connecting pad 423M in the −X-axis direction are cut off due to the application of the low-melting-point glass LG in the Y'-axis direction. It is desired to form a joining electrode (not shown) covering a part or the entire external electrode 425*c* (see FIG. 18D), the base edge-surface electrode 423*c*, and the extraction electrode 403*b'*, so that the extraction electrode 403*b'* and the connecting pad 423M in the +X-axis direction are assuredly connected together. Accordingly, the length of the outer frame 408 is minimized and forming a larger quartz-crystal vibrating portion 401 is allowed.

<Method for Manufacturing a Fourth Quartz-crystal Vibrating Device 400'>

The method for manufacturing the alternative configuration of the fourth embodiment of a vibrating device 400' essentially follows the method in the fourth embodiment. Thus, in the alternative configuration of the fourth embodiment, cuts of the bonded together lid wafer 41W, quartz-crystal wafer 40W and base wafer 42W into individual fourth quartz-crystal vibrating devices 400', are made along the first scribe line SL1 where the through-holes BH1 are formed. Then, the bonded-together lid wafer 41W, quartz-crystal wafer 40W and base wafer 42W are cut along the scribe line SL2 where the through-holes BH1 are not formed.

According to this cutting process, duration of load onto the base wafer 42W during cutting process can be shortened. Accordingly, damage to the base wafer 42W, such as peeling of electrodes, is prevented.

Industrial Applicability

Representative embodiments have been described in detail above. As evident to those skilled in the art, the present invention may be changed or modified in various ways within the technical scope of the invention.

For example, although the present disclosure was explained within the context of AT-cut quartz-crystal vibrating piece, it can be replaced with a tuning-fork type quartz-crystal vibrating piece.

Also, although low-melting-point glass was used for bonding together the base wafer, quartz-crystal wafer, and lid wafer, this bonding material can be replaced with polyimide resin. Whenever polyimide resin is applied, it can be used for screen-printing or exposure after applying a photosensitive polyimide resin on the entire surface.

In this specification, although the various embodiments have been described in the context of quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

What is claimed is:

1. A piezoelectric device, comprising:
a vibrating portion that vibrates whenever an electrical voltage is applied;
a first plate having a first rectangular profile including a pair of straight first edges and a pair of second edges situated vertically to the pair of straight first edges and configured longer than the pair of straight first edges, the first plate constituting a part of the package for storing the vibrating portion;
a second plate having a second rectangular profile, the second plate being bonded to the first plate and constituting another part of the package for storing the vibrating portion,
mounting terminals formed on a surface opposite to a surface bonded to the second plate on the first plate, and
edge-surface electrodes connecting to the mounting terminals and formed on an edge surface of the first plate,
wherein a pair of castellations is formed on each of the pair of straight first edges, the pair of castellations being recessed toward a center of the package base, and the pair of castellations is divided along a straight line that passes through a centerline of the first plate and is formed parallel to the pair of second edges, the edge-surface electrodes is only formed on the castellations.

2. The piezoelectric device of claim 1, wherein the first plate comprises a package base for mounting the vibrating portion and forming the piezoelectric device, and the second plate comprises a package lid bonded onto the package base and hermetically seals the vibrating portion.

3. The piezoelectric device of claim 1, wherein the second plate comprises a piezoelectric frame having the vibrating portion and an outer frame surrounding the vibrating portion thereof for constituting the other part of the package, the first plate comprises a package base that is bonded onto a first surface of the outer frame of the piezoelectric frame, and the piezoelectric device further comprises a package lid that is bonded to a second surface of the outer frame of the piezoelectric frame, the package lid constitutes a part of the package for hermetically sealing the vibrating portion.

4. The piezoelectric device of claim 1, wherein the first plate and the second plate are bonded using an adhesive, wherein the adhesive is fabricated from a glass material that melts between 350° C. to 410° C.

5. The piezoelectric device of claim 2, wherein the first plate and the second plate are bonded using an adhesive, wherein the adhesive is fabricated from a glass material that melts between 350° C. to 410° C.

6. The piezoelectric device of claim 3, wherein the first plate and the second plate are bonded using an adhesive, wherein the adhesive is fabricated from a glass material that melts between 350° C. to 410° C.

* * * * *